(12) United States Patent
Maheshwari

(10) Patent No.: US 12,260,118 B2
(45) Date of Patent: Mar. 25, 2025

(54) DETERMINISTIC NEAR-COMPUTE MEMORY FOR DETERMINISTIC PROCESSOR AND ENHANCED DATA MOVEMENT BETWEEN MEMORY UNITS AND PROCESSING UNITS

(71) Applicant: Groq, Inc., Mountain View, CA (US)

(72) Inventor: Dinesh Maheshwari, Fremont, CA (US)

(73) Assignee: Groq, Inc., Mountain View, CA (US)

( * ) Notice: Subject to any disclaimer, the term of this patent is extended or adjusted under 35 U.S.C. 154(b) by 79 days.

(21) Appl. No.: 18/079,722

(22) Filed: Dec. 12, 2022

(65) Prior Publication Data

US 2023/0115494 A1    Apr. 13, 2023

Related U.S. Application Data

(63) Continuation of application No. PCT/US2021/037488, filed on Jun. 15, 2021.

(60) Provisional application No. 63/047,800, filed on Jul. 2, 2020, provisional application No. 63/039,982, filed on Jun. 16, 2020.

(51) Int. Cl.
*G06F 3/06* (2006.01)

(52) U.S. Cl.
CPC ............ *G06F 3/0656* (2013.01); *G06F 3/061* (2013.01); *G06F 3/0679* (2013.01)

(58) Field of Classification Search
CPC ....... G06F 3/0656; G06F 3/061; G06F 3/0679
See application file for complete search history.

(56) References Cited

U.S. PATENT DOCUMENTS

| | | | |
|---|---|---|---|
| 2010/0180140 A1 | 7/2010 | Satoh et al. | |
| 2010/0314730 A1* | 12/2010 | Labeeb | H01L 25/0657 257/676 |
| 2014/0129752 A1 | 5/2014 | Scorsi et al. | |
| 2017/0286017 A1* | 10/2017 | Ware | G11C 7/22 |
| 2019/0042251 A1* | 2/2019 | Nurvitadhi | G06N 3/02 |
| 2019/0057023 A1* | 2/2019 | Hassan | G06F 12/0238 |
| 2019/0079677 A1* | 3/2019 | Malladi | G06F 3/0659 |
| 2020/0034946 A1 | 1/2020 | Surti et al. | |

(Continued)

OTHER PUBLICATIONS

Abts, D. et al. "Think Fast: A Tensor Streaming Processor (TSP) for Accelerating Deep Learning Workloads," *ACM/IEEE 47th Annual International Symposium on Computer Architecture*, May 30-Jun. 3, 2020, pp. 145-158.

(Continued)

*Primary Examiner* — Henry Tsai
*Assistant Examiner* — Christopher A Daley
(74) *Attorney, Agent, or Firm* — Dority & Manning, P.A.

(57) ABSTRACT

A deterministic apparatus comprising a deterministic near-compute memory communicatively coupled with and proximate to a deterministic processor. The deterministic near-compute memory comprises a plurality of data banks having a global memory address space, a control bus, a data input bus and a data output bus for each data bank. The deterministic processor is configured to initiate, via the control bus, retrieval of a set of data from the plurality of data banks. The retrieved set of data comprises at least one row of a selected one of the data banks passed via the data output bus onto a plurality of stream registers of the deterministic processor.

20 Claims, 23 Drawing Sheets

(56) References Cited

U.S. PATENT DOCUMENTS

| | | |
|---|---|---|
| 2020/0098692 A1 | 3/2020 | Liff et al. |
| 2020/0294182 A1* | 9/2020 | George .............. G06F 15/7807 |
| 2021/0149586 A1* | 5/2021 | DeLaCruz .............. G11C 8/14 |
| 2021/0247978 A1* | 8/2021 | Malladi ................. G06F 9/3016 |
| 2022/0392519 A1* | 12/2022 | Osborne ................ H01L 25/18 |
| 2023/0024670 A1* | 1/2023 | Abts ....................... G06F 15/80 |

OTHER PUBLICATIONS

Rixner, S. et al. "Memory Access Scheduling," *ACM SIGARCH Computer Architecture News*, vol. 28, No. 2, May 2000, pp. 128-138.

PCT International Search Report and Written Opinion, PCT Application No. PCT/US21/37488, Dec. 20, 2021, 21 pages.

Stow, D. et al. "Cost-Effective Design of Scalable High-Performance Systems Using Active and Passive Interposers," *IEEE/ACM International Conference on Computer-Aided Design*, Nov. 13-16, 2017, pp. 728-735.

Communication pursuant to Rules 70(2) and 70a(2) EPC received for European Patent Application Serial No. 21826540.3 dated Jun. 28, 2024, 1 page.

Extended European Search Report for European Application No. 21826540.3 dated Jun. 11, 2024, 10 pages.

Abts et al., "Think Fast: A Tensor Streaming Processor (TSP) for Accelerating Deep Learning Workloads," ACM/IEEE 47th Annual International Symposium on Computer Architecture, 2020, 14 pages.

Stow et al., "Cost-Effective Design of Scalable High-Performance Systems Using Active and Passive Interposers," IEEE, 2017; 8 pages.

* cited by examiner

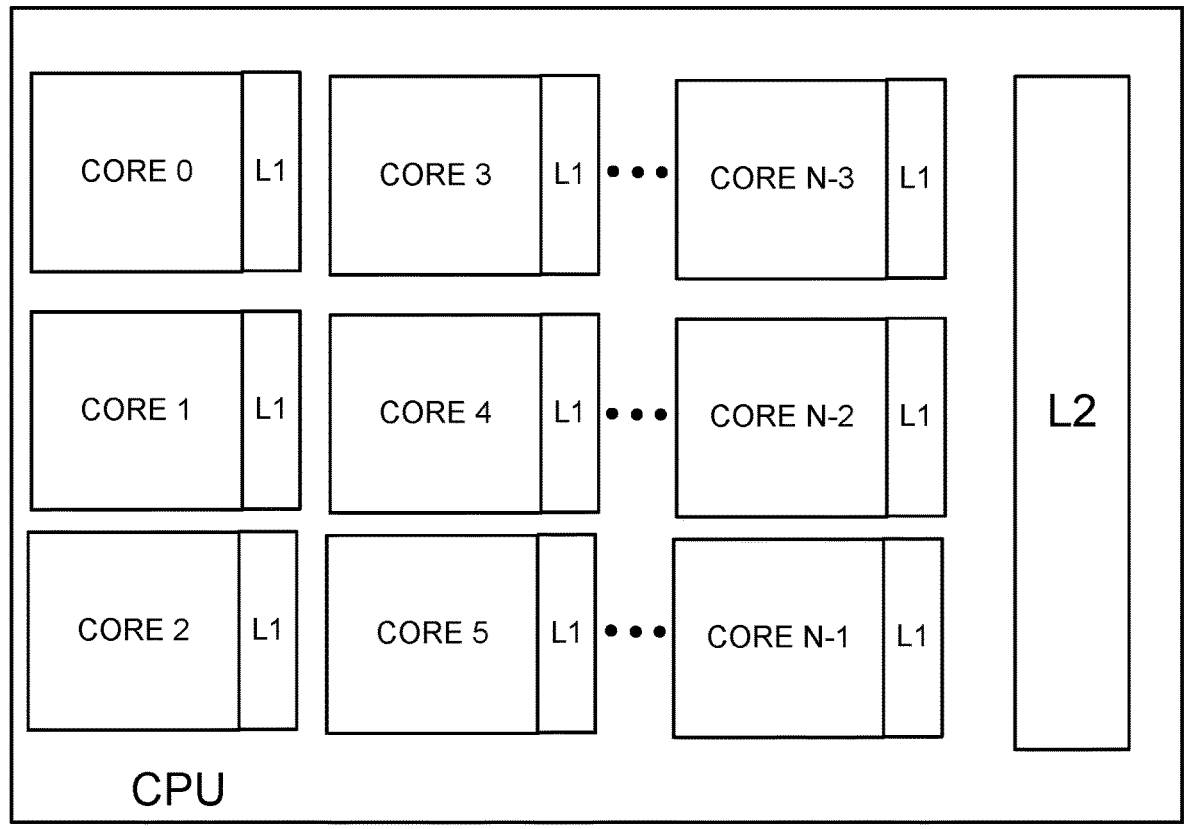
PRIOR ART
FIG. 2

DRAM for TSP
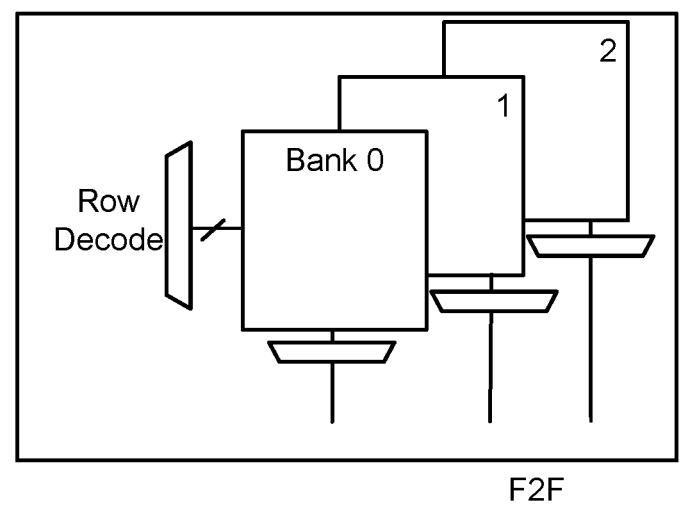
F2F
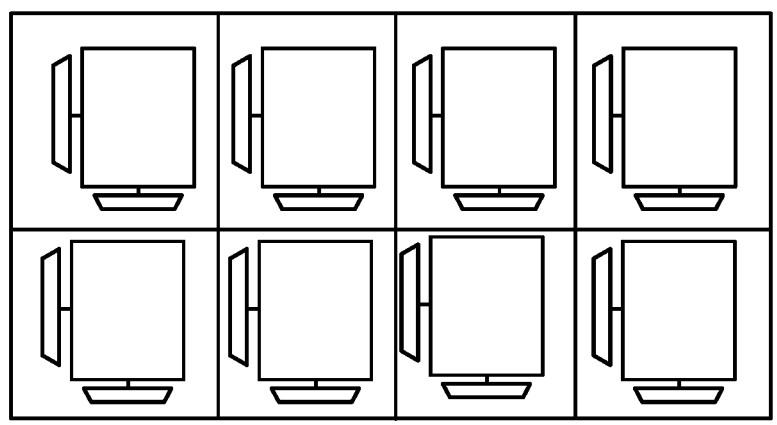
FIG. 11B

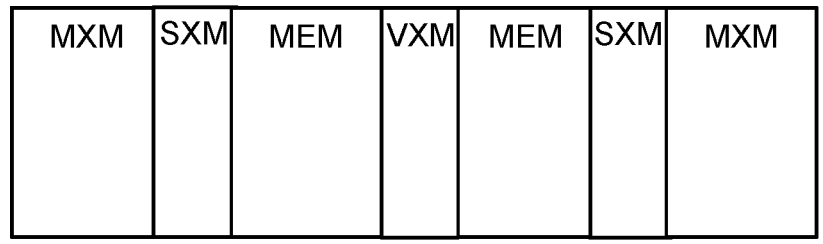
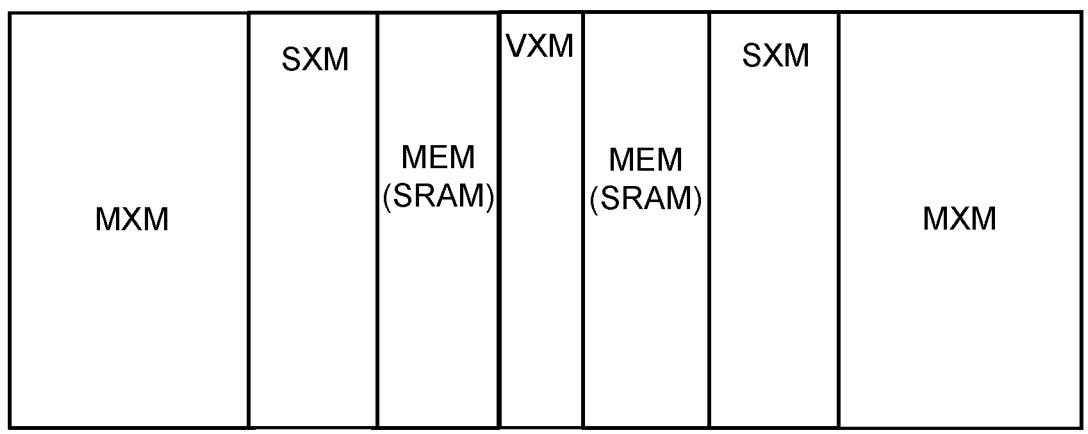
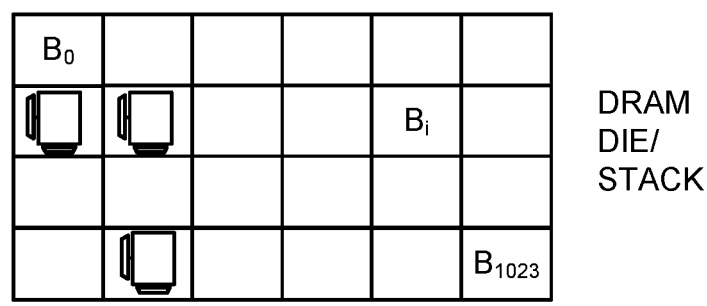
FIG. 13

1600

```
STORE A SET OF DATA IN A PLURALITY OF DATA
BANKS OF A DETERMINISTIC NEAR-COMPUTE
MEMORY COUPLED TO A DETERMINISTIC
PROCESSOR, THE PLURALITY OF DATA BANKS
HAVING A GLOBAL MEMORY ADDRESS SPACE, A
CONTROL BUS, A DATA INPUT BUS AND A DATA
OUTPUT BUS FOR EACH DATA BANK
1610
```

↓

```
INITIATE, VIA THE CONTROL BUS, RETRIEVAL OF A
SET OF DATA FROM THE PLURALITY OF DATA BANKS
USING THE GLOBAL MEMORY ADDRESS SPACE, THE
RETRIEVED SET OF DATA COMPRISING AT LEAST ONE
ROW OF A SELECTED ONE OF THE DATA BANKS
PASSED VIA THE DATA OUTPUT BUS ONTO A
PLURALITY OF STREAM REGISTERS OF THE
DETERMINISTIC PROCESSOR
1620
```

FIG. 16

DETERMINISTIC NEAR-COMPUTE MEMORY FOR DETERMINISTIC PROCESSOR AND ENHANCED DATA MOVEMENT BETWEEN MEMORY UNITS AND PROCESSING UNITS

CROSS-REFERENCE TO RELATED APPLICATIONS

This application is a bypass continuation of International Application No. PCT/US2021/037488, filed on Jun. 15, 2021, which claims a benefit and priority to U.S. Provisional Patent Application Ser. No. 63/039,982, filed on Jun. 16, 2020, and to U.S. Provisional Patent Application Ser. No. 63/047,800, filed on Jul. 2, 2020, each of which is incorporated by reference in its entirety.

TECHNICAL FIELD

The present disclosure generally relates to computer processors and memory structures, and more specifically to deterministic near-compute memory for deterministic processor and enhanced data movement between memory units and processing units.

BACKGROUND

Deep learning models can now recognize images, understand natural language, play games, and automate system decisions (e.g., device placement and indexing). Tensor operators, such as matrix multiplication and high dimensional convolution, are basic building blocks of deep learning models. Large machine learning and high-performance compute tasks require huge amounts of compute memory bandwidth and compute memory density. That memory capacity, however, comes at a high price in terms of power consumption. More efficient memory subsystems are needed.

Current central processing unit (CPU) and graphics processing unit (GPU) architectures are not deterministic and use out-of-order (OOO), speculative execution and other techniques in an endeavor to improve performance. Speculative execution, broadly speaking, is an execution model in which instructions can be fetched and enter the pipeline and even begin execution without even knowing for sure that they will indeed be required to execute (according to the control flow of the program). The term is also often used to specifically refer to speculative execution in the execution stage of the pipeline.

On the other hand, the OOO execution is an execution model in which instructions can be executed in an order that is potentially different from the program order. However, the instructions are still retired in program order so that the program's observed behavior is the same as the one intuitively expected by the programmer. This in turn requires a memory subsystem that is access-time compatible with the compute units and have high bit density to support large workloads.

Such a memory subsystem comprises a hierarchy of static random-access memory (SRAM) caches (e.g., L1, and L2) to support high random access and a large dynamic random-access memory (DRAM) memory to support the large state space (i.e., storage capacity) with high bandwidth to fill the caches. For large tasks, as the state space is swapped into the caches, the bandwidth to the main memory becomes the limiting factor.

DRAM memory is one of the embodiments of a random transaction rate (RTR) memory. The disclosure below including RTR memory will be understood as DRAM and other RTR types of memory.

RTR represents a number of fully random memory accesses (reads or writes) that can be performed on the memory subsystem and is independent of the number of bits being accessed for the transaction (transaction bit width). RTR would be measured in million transactions per second or MT/s.

The traditional CPU/GPU memory subsystem requirements are the following: (a) high RTR caches with L1 cache that is access time compatible with compute units; (b) high bit density main memory for task state space; (c) high bandwidth from main memory to cache memory; (d) low per-bit cost main memory that is expandable to variable amounts of memory. A conventional CPU/GPU memory hierarchy is shown in Figure (FIG. 1 and FIG. 2. Hierarchical memory subsystems that rely on multiple levels of caches are inherently inefficient.

Evolution of DRAM memory has been a response to the above stated requirements. The focus has been on large density at low cost per bit per package with increasing density and bandwidth to the CPU cache with each generation. However, the RTR has remained approximately the same—approximately 50 ns (i.e., access frequency of 20 MHz) for the past few decades.

DRAM is organized into many banks per chip. Only a certain number of banks can be active at any time. In each bank, the core accesses a large row, e.g., (1-8) KB, approximately every 50 ns (or with access frequency of 20 MHz) that is latched into the latching sense amp. The addressed word accessed by the relevant columns of sense amp latches into the chip data-buffer at, e.g., 200 MHz to 500 MHz. The word is then streamed out of the narrower chip data bus at a much higher frequency, e.g., 1.6 GHz to 3.2 GHz today.

Machine learning models are becoming larger, and the workloads increasingly require a large state space in weights and working states. For Natural language Processing (NLP), recommendation models, language translation, and other similar models, the operational intensity seems to saturate (converge to a constant value) as model sizes increase.

In contrast, for Computer Vision (CV) models, the operational intensity keeps increasing (because the compute requirements keep increasing) as model sizes increase. The arithmetic intensity, also referred to as operational intensity, is the ratio of the total floating points operations (the number of operations performed by a given kernel or application) to the memory traffic (the number of bytes of memory transfers incurred during the execution of the kernel or application).

Therefore, the requirement on the memory subsystem is high memory capacity and high bandwidth to memory to balance with the high compute density required for these tasks to be done in a reasonable time.

SUMMARY

The Tensor Streaming Processor (TSP) architecture is deterministic, and the memory accesses are therefore deterministic as well. Given the unprecedented compute density enabled by the TSP architecture, for the requisite operational intensity of the Machine Learning (ML) models, the TSP's architecture also supports unprecedented memory bandwidth.

As a single core architecture, the TSP device supports an extremely high bandwidth, chip-wide data path that allows all compute elements in the chip to have access to a global memory space directly without a cache hierarchy.

The TSP is uniquely positioned to enable use of dynamic random-access memory (DRAM), magneto-resistive random-access memory (MRAM), NOR flesh memory, etc. as near-compute memory to directly compute from without a cache hierarchy.

Given the simple requirements of the TSP memory access, by using DRAM as near-compute memory, the TSP architecture enables simplification of the DRAM architecture while improving bandwidth, concurrency, power and per-bit cost for DRAM over existing DRAM architectures.

The TSP has already demonstrated approximately seven times better compute density per transistor and significantly improved memory bandwidth compared to the dominant commercially available graphics processing unit (GPU) incumbent.

Balancing memory capacity for such large tasks with high compute density such as that of the TSP's architecture suggests the use of high-density memories such as DRAM as a preferred compute memory.

However, the TSP architecture being deterministic uniquely allows for use of memories such as DRAM (and even slow non-volatile memory (NVM) such as MRAM, NOR flesh memory, etc.) that are much slower in random access but do enable extremely high density per device at much lower bit cost to be used as near-compute memory. This coupled with the TSP architecture's high bandwidth global data path mated with stacking technologies allows for coupling the high-density memories (like DRAM) directly to the compute units in the TSP single core. The result is an extremely high-density compute engine coupled to an extremely high density near-compute memory with an extremely high bandwidth data path enabling a device that is balanced in compute density, memory bandwidth and memory density. This allows for use of a significantly smaller number of devices for large tasks resulting in a significantly lower accessory (like host processors, storage, networking, power subsystems etc.) usage and correspondingly lower energy consumption.

Because many modern high-performance reduced instruction set computer (RISC), complex instruction set computer (CISC) and graphics processing units (GPU) architectures are not deterministic, they cannot directly use DRAM because the effective random transaction rate (RTR) is too slow (e.g., approximately 25M RTR/s corresponding to Row Cycle Time (tRC) of 40 ns)—these architectures require a cache hierarchy wherein the caches provide the RTR required. Also, because these competing architectures use a large number of cores and do not have a high bandwidth global data path like the TSP, they cannot use high bandwidth stacking techniques to access DRAM as a global addressable space. Global data path means that the switching network is substantially exclusively located on the processor die. Global addressable space means that each memory address is globally accessible to the processor independent of which bank the data is stored.

Thus, the prior art RISC, CISC and GPU architectures can use only a set of banks for each core but not as global memory. Also, because the prior art DRAM RTR is too low, DRAM banks cannot be used as a local cache in the hierarchy.

One embodiment relates to a deterministic processor and a deterministic near-compute memory. The deterministic near-compute memory is communicatively coupled with and placed within a defined vicinity from, by way of example, a single core deterministic TSP. The deterministic near-compute memory comprises a plurality of data banks having a global memory address space, a control bus, a data input bus and a data output bus for each bank. The deterministic processor (e.g., the single core deterministic TSP) is configured to initiate, via the control bus, retrieval of a set of data from the plurality of data banks. The retrieved set of data comprises at least one row of a selected one of the data banks passed via the data output bus onto a plurality of stream registers of the deterministic processor.

Another embodiment relates to a near compute memory device comprising a plurality of memory banks, each memory bank having a plurality of rows for storing data. Each memory bank is independently and concurrently addressable by a processor (e.g., the single core deterministic TSP) for writing first data to a selected row in a first selected bank of the plurality of memory banks and for reading second data from a selected row in a second selected bank of the plurality of memory banks. The second data is read a predetermined time-period before the second data is required to arrive at one or more compute elements of the processor, and the first data is written prior to or after a known refresh of the first selected bank.

The present disclosure further relates to a method of deterministic computing using at least one deterministic processor coupled to a deterministic near-compute memory in one embodiment, the method comprising: storing a set of data in a plurality of data banks of the deterministic near-compute memory, the plurality of data banks having a global memory address space, a control bus, a data input bus and a data output bus for each data bank; and initiating, via the control bus, retrieval of a set of data from the plurality of data banks using the global memory address space, the retrieved set of data comprising at least one row of a selected one of the data banks passed via the data output bus onto a plurality of stream registers of the deterministic processor.

The present disclosure further relates to a method for arranging interface connections and assembly relationship of processor and memory integrated circuits to enable enhanced data communication between devices. The present disclosure also provides methods for reducing degradation of signal integrity that results from signals traversing long distances between circuits when using other assembly methods. The present disclosure facilitates high bandwidth access to high density memory.

BRIEF DESCRIPTION OF THE DRAWINGS

FIG. 2 illustrates a prior art typical CPU/GPU memory hierarchy of a computer system with large number of cores for use in commerce.

FIG. 11B illustrates the proprietary DRAM architecture for Groq TSP chip that is configured for a concurrent global access to multiple banks of DRAM simultaneously, in accordance with some embodiments.

FIG. 13 illustrates a DRAM architecture compatible for use with another embodiment of a TSP configuration, in accordance with some embodiments.

FIG. 16 is a flowchart illustrating a method of deterministic computing using at least one processor comprising a single core deterministic TSP coupled to an off-chip deterministic near-compute memory unit, in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

The Figures and Detailed Description, only to provide knowledge and understanding, signify at least one embodiment. To minimize the length of the Detailed Description, while various features, structures or characteristics can be described together in a single embodiment, they also can be used in other embodiments without being written about. Variations of any of these elements, and modules, processes, machines, systems, manufactures, or compositions disclosed by such embodiments and/or examples are easily used in commerce. The Figures and Detailed Description signify, implicitly or explicitly, advantages and improvements of at least one embodiment for use in commerce.

In the Figures and Detailed Description, numerous specific details can be described to enable at least one embodiment. Any embodiment disclosed herein signifies a tangible form of a claimed disclosure. To not diminish the significance of the embodiments and/or examples in this Detailed Description, some elements that are known to a skilled person can be combined for presentation and for illustration purposes and not be specified in detail. To not diminish the significance of these embodiments and/or examples, some well-known processes, machines, systems, manufactures, or compositions are not written about in detail. However, a skilled person can use these embodiments and/or examples in commerce without these specific details or their equivalents. Thus, the Detailed Description focuses on enabling the inventive elements of any embodiment. Where this Detailed Description refers to some elements in the singular tense, more than one element can be depicted in the Figures and like elements are labeled with like numerals.

Figure 1:
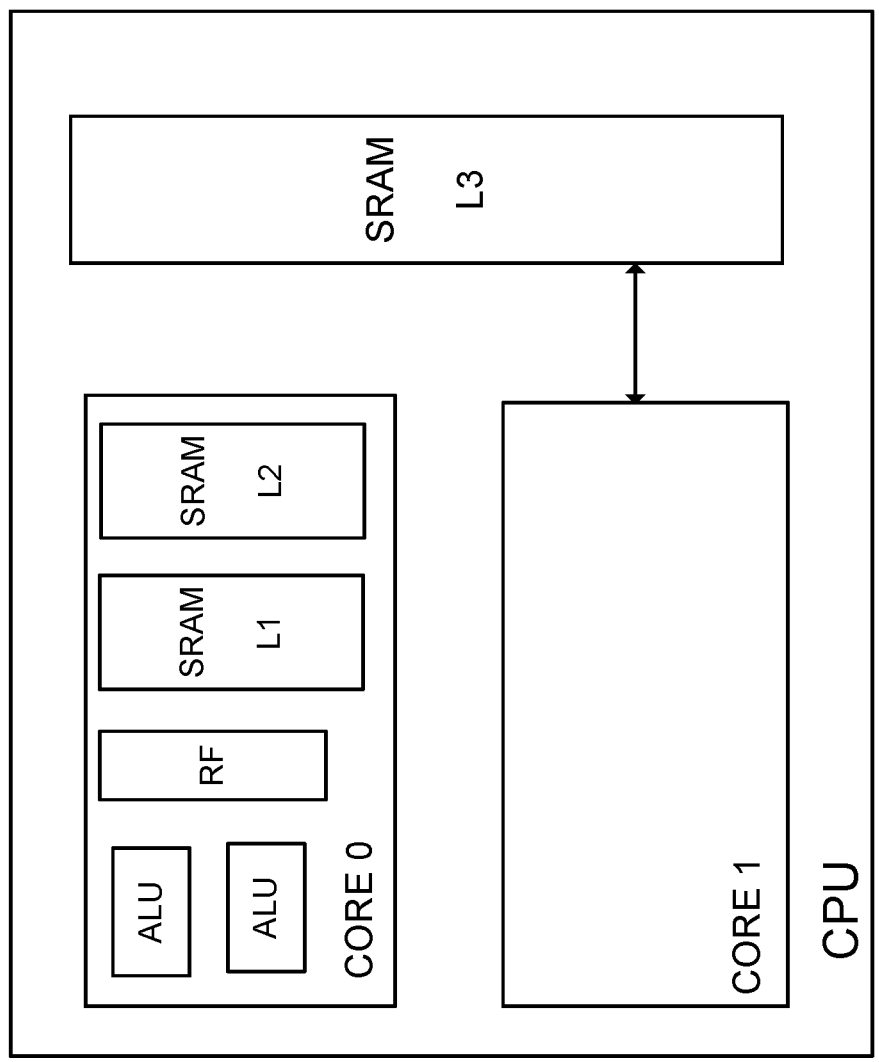
FIG. 1 depicts a prior art typical central processing unit/general purpose unit (CPU/GPU) memory hierarchy of a computer system.
Figure 3A:
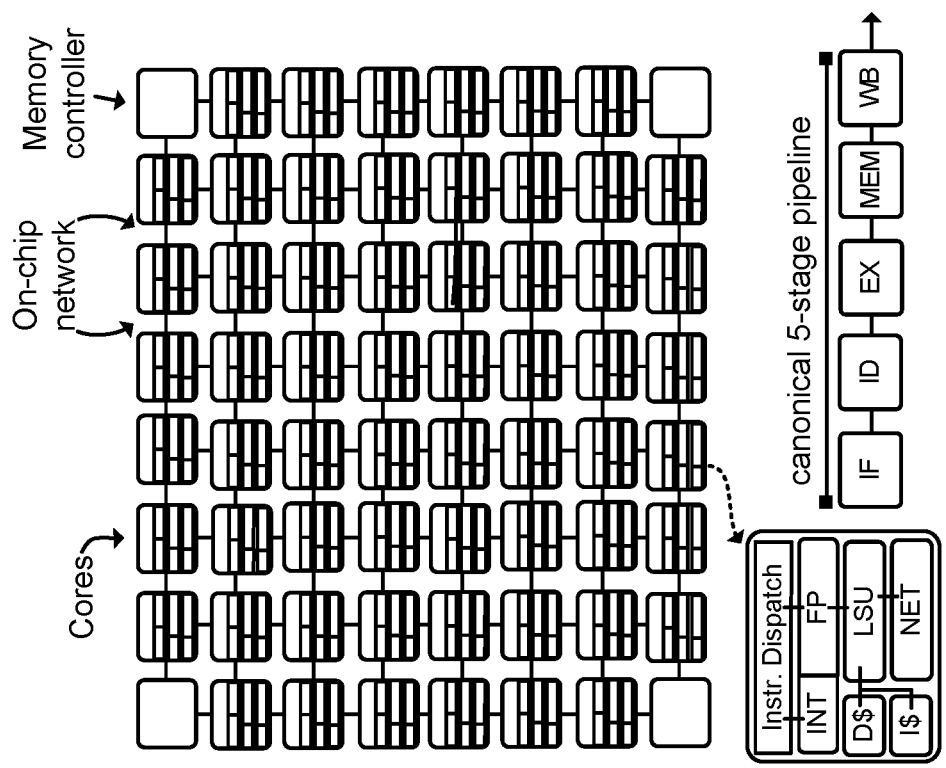
FIG. 3A shows a conventional chip two-dimensional (2D) mesh of cores.
Figure 3B:
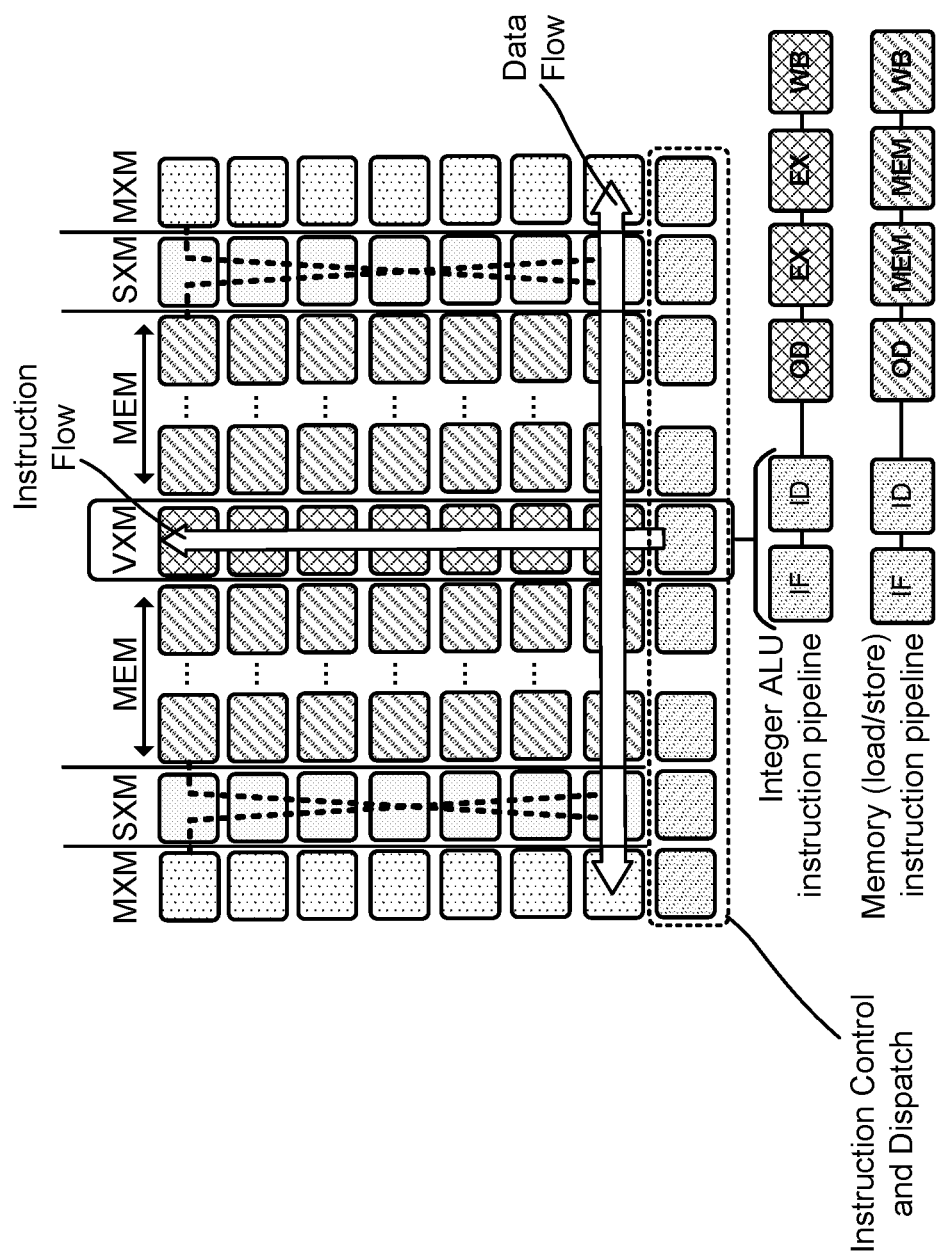
FIG. 3B shows a functionally sliced arrangement of tiles in a Tensor Streaming Processor (TSP), in accordance with some embodiments.

In accordance with embodiments of the present disclosure, the processor plane comprises a Groq Tensor Streaming Processor (TSP) commercially available from GROQ, INC. of Mountain View, California. It is to be understood that although many embodiments described herein use the TSP as the preferred processors, other deterministic processors may be used in commercial applications. FIG. 3A shows a conventional chip 2D mesh of cores. FIG. 3B shows a functionally sliced arrangement of tiles in the GROQ TSP, in accordance with some embodiments.

The GROQ TSP uses a tiled microarchitecture that allows a compiler to scale vector size to the underlying tensor shapes which they represent. Tensor computations are performed using a streaming processing model where computational elements are arranged spatially by function to take advantage of dataflow locality as tensors flow past. This novel approach enables significantly better performance than the state-of-the-art graphic processing unit (GPU), with initial ResNet-50 image classification results of 20.4K sample images per second (IPS) using a batch-size of one—an approximately four times improvement compared to other commercially available modern GPUs and accelerators.

ResNet-50 is a pretrained Deep Learning model for image classification of the Convolutional Neural Network (CNN, or ConvNet), which is a class of deep neural networks, most applied to analyzing visual imagery. ResNet-50 is 50 layers deep and is trained on a million images of 1000 categories from the ImageNet database. Furthermore, the model has over 23 million trainable parameters, which indicates a deep architecture that makes it better for image recognition.

Certain core architectural elements set the GROQ TSP apart from GPU and accelerators. As shown in FIG. 3A, in a conventional chip multiprocessor (CMP) each "tile" is an independent core which is interconnected using the on-chip network to exchange data between cores. Instruction execution is carried out over several stages: (i) instruction fetch (IF), (ii) instruction decode (ID), (iii) execution (EX) on Arithmetic Logic Units (ALUs), (iv) memory access (MEM), and (v) writeback (WB) to update the results in the general-purpose registers (GPRs).

As shown in FIG. 3B, in contrast from conventional multicore, where each tile is a heterogeneous collection of functional units but globally homogeneous, the GROQ TSP inverts that to have a local functional homogeneity but chip-wide (global) heterogeneity.

More specifically, the TSP reorganizes the homogeneous two-dimensional (2D) mesh of cores in FIG. 3A into the functionally sliced microarchitecture shown in FIG. 3B. In this approach, each tile implements a specific function and is stacked vertically into a specific "slice" in the Y-dimension of the 2D on-chip mesh. The TSP disaggregates the basic elements of a core in FIG. 3A per their respective functions: instruction control and dispatch (e.g., via instruction control unit (ICU)), memory (MEM), integer (INT) arithmetic, float point unit (FPU) arithmetic, and network (NET) interface, as shown by the slice labels at the top of FIG. 3B. Each row of the 2D on-chip mesh contains a cross-section of all functional slices (see FIG. 4).

In this organization, each functional slice is independently controlled by a sequence of instructions specific to its on-chip role. For instance, the MEM slices support Read and Write but not, necessarily Add or Mul, which are typically performed in arithmetic functional slices (e.g., the vector execution module (VXM) and matrix execution module (MXM) slices) for some typical machine learning (ML) algorithms, such as the linear regression algorithm.

All functional slice's tiles execute the same instruction stream—Single Instruction Multiple Data (SIMD) instructions. Thus, the common instruction decode and dispatch logic can be factored out into its own tile (i.e., ICU) and decompose the normal instruction execution pipeline into two areas: (i) instruction fetch, decode, and parceling and (ii) operand read, execute, and writeback. This approach decouples the memory subsystem from the functional units retrieving their operands and depositing results.

Each functional slice implements, in one embodiment, a 20-stage vector pipeline that spans the tiles of each slice, with each tile producing 16 elements of the 320-element maximum vector length. This organization naturally decomposes instruction flow in the vertical dimension, and data flow in the horizontal dimension as the data flow passes over different function types. With this processor organization, instruction execution is carried out by different tiles: instruction fetching and decoding in the ICU and operand decode, execution and writeback at each tile of functional slice as the (vertical flowing) dispatched instruction intersects with the (horizontal flowing) operand data on which the dispatched instruction is operating. It will be appreciated that reference to 'vertical' and 'horizontal' or 'north', 'south', 'east' and 'west' are used in connection with the illustrations shown in the Figures, are abstractions that are solely intended to aid the reader and should not be inferred as technical limitations.

Parallel Lanes and Streams

Data parallelism for each slice's SIMD execution is provided via a programming abstraction called parallel lanes. These parallel lanes correspond to elements of data vectors, an abstraction common to many ML frameworks like TensorFlow.

In the GROQ TSP model, instructions flow northward from the ICUs to the functional slices, while data (operands and results) primarily flow east and west between functional slices. Any inter-lane data movement within a vector uses the on-chip network slice.

Figure 5:
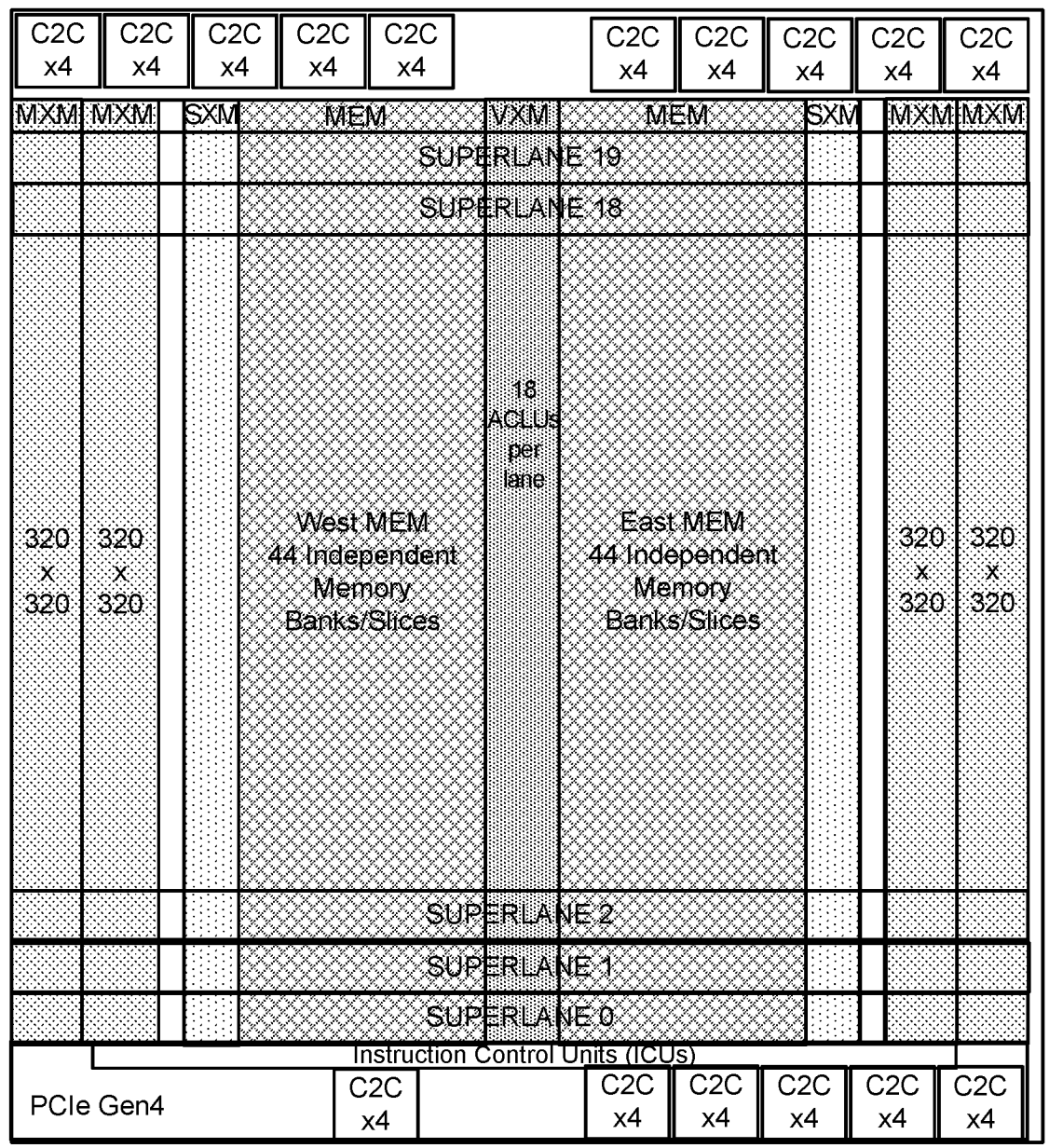
FIG. 5 illustrates a die photo of 14 nm ASIC implementation of the Groq TSP, in accordance with some embodiments.

As shown in FIG. 3 and FIG. 5, the on-chip network is implemented as X-dim mesh and Y-dim mesh of tiles with X-Y-X dimension order routing.

Figure 4:
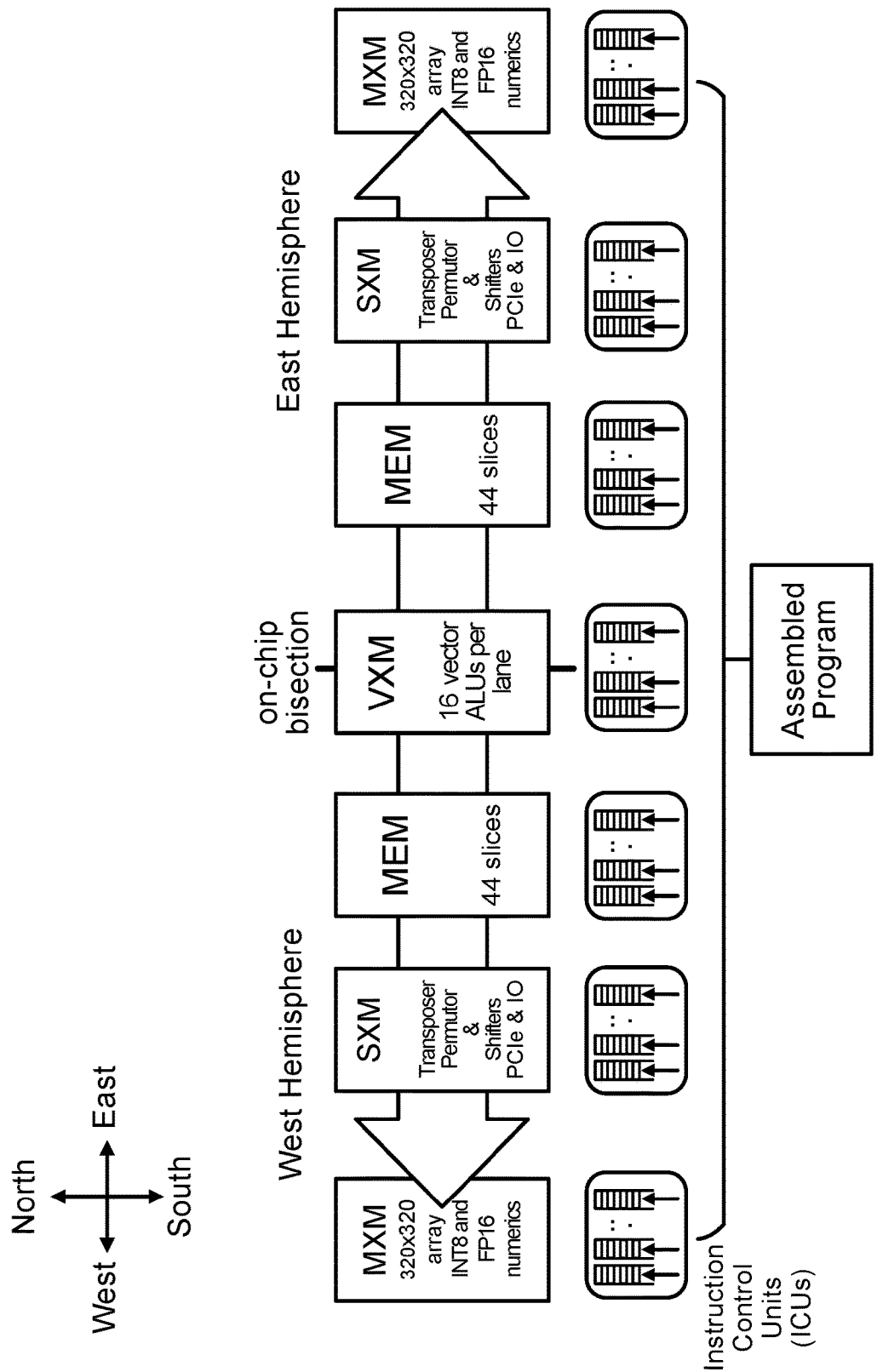
FIG. 4 depicts the organization and dataflow within a row in the on-chip network in the TSP, in accordance with some embodiments.

Each instruction specifies the first hop direction (east or west), so memory instruction semantics have both an address and a dataflow direction (see FIG. 4). Streams are routed in the X-dimension through MEM and routed in the Y-dimension using the SXM's permuter and lane-shifters to move data elements vertically. The SXM's permuter implements a permutation function that is a mathematical technique that determines the number of possible arrangements in a set when the order of the arrangements matters. Common mathematical problems involve choosing only several items from a set of items with a certain order.

The MEM and the SXM provide deterministic routing of stream data as the stream data flows in the X and Y dimensions, respectively. With the GROQ TSP architecture, functional slices interact with streams of data in a producer-consumer fashion. That is, they consume operands from streams and produce results onto a (possibly different) stream, like an assembly line operator (functional slice) and conveyor belt (stream).

Conceptually, the functional slices are fixed and data is flowing across processing elements as shown in FIG. 4. As the data flows through the slice, each functional unit can optionally intercept the data operands and compute a result (if the functional unit is a processing element like an arithmetic logic unit (ALU)) or move data between lanes on the network if the functional unit is a switching element.

Streams provide a programming abstraction and are a conduit through which data flows between functional slices. Unlike GPRs, the functional slices operate on streams of parallel data flowing East or West (horizontally) across chip. The horizontally flowing streams carrying operands intercept the vertically (Northward) flowing instructions (see FIG. 4) to perform a computation at a computational unit on a functional slice. A compiler precisely maintains the chip's architectural state and uses that knowledge to ensure that instructions correctly intercept its stream operand(s).

Streams are implemented in hardware by a chip-wide streaming register file (SR). They are architecturally visible and transport operands and results between slices. A common software pattern involves reading operand data from one or more MEM slices that is then subsequently consumed and operated on by a downstream arithmetic slice. The results of the operation are then produced onto another stream such that they can be written back to memory or passed to subsequent computational units. For example, a $Z=X+Y$ operation might require four instructions: Read S1, X and Read S2, Y are executed on two MEM slices and directed inward toward an ALU slice to perform the Add S1, S2, S3. Lastly, the result is stored back to memory via a Write S3, Z. The streams represent a collection of N-elements, operated upon in a SIMD manner by each functional slice.

GROQ TSP Architecture Overview

The GROQ TSP architecture makes several deliberate tradeoffs on the hardware-software interface, pushing the complexities associated with scheduling into the compiler. Specifically, it falls on the compiler to precisely schedule instructions to use the hardware correctly and efficiently. At times this may involve selecting one of several means by which an algorithm or meta-operation may be realized on the hardware. Removing the control complexity of dynamic instruction scheduling for multi-issue execution units allows the ICU to be relatively small, accounting for less the 3% of the chip area.

The compiler has access to 320-lane programming abstraction overlaid on the TSP block diagram (see FIG. 5) where each tile in the on-chip mesh operates on 16-lanes in a SIMD manner. The 16-lane unit can be referred to as a "superlane" which is a cross-section of all the functional slices on the chip and the minimum granularity of computation. As such, a superlane represents the architecture's minimum vector length, minVL, of 16 elements. Likewise, the vertical composition of 20 tiles to form a functional slice (see FIG. 5) produces a maximum vector length, maxVL, of 20×16=320 elements.

The compiler has access to 144 independent instruction queues (i.e., ICUs) on-chip: (a) six for Westward MXM including two independent 2D MAC (multiply-accumulate) arrays; (b) 14 for Westward SXM for intra-superlane and inter-lane switching by rearranging elements of vectors; (c) 44 for Westward MEM including 44 parallel memory slices of static random-access memory (SRAM); (d) 16 for VXM including 16 vector ALUs per lane; (e) 44 for Eastward MEM—including 44 parallel memory slices of SRAM; (f) 14 for Eastward SXM; and (g) six for Eastward MXM including two independent 2D MAC arrays), whereas each instruction queue can issue one or more instructions per cycle and the compiler has explicit control of the program order in each instruction queue.

The compiler has access to 64 logical streams per lane. For example, 32 logical streams are required to operate on 16 minVL per lane for moving operands or results on-chip with 32 streams Eastward, and 32 streams Westward, as shown in FIG. 4.

The compiler has access to 220 MBytes of globally shared SRAM that delivers 32 bytes per lane of stream bandwidth and low-latency access to model parameters. For example, the MEM can read and MXM can install 400K weights into all four 320×320 arrays in less than 40 cycles including SRAM and on-chip network transit delay.

Figure 6:
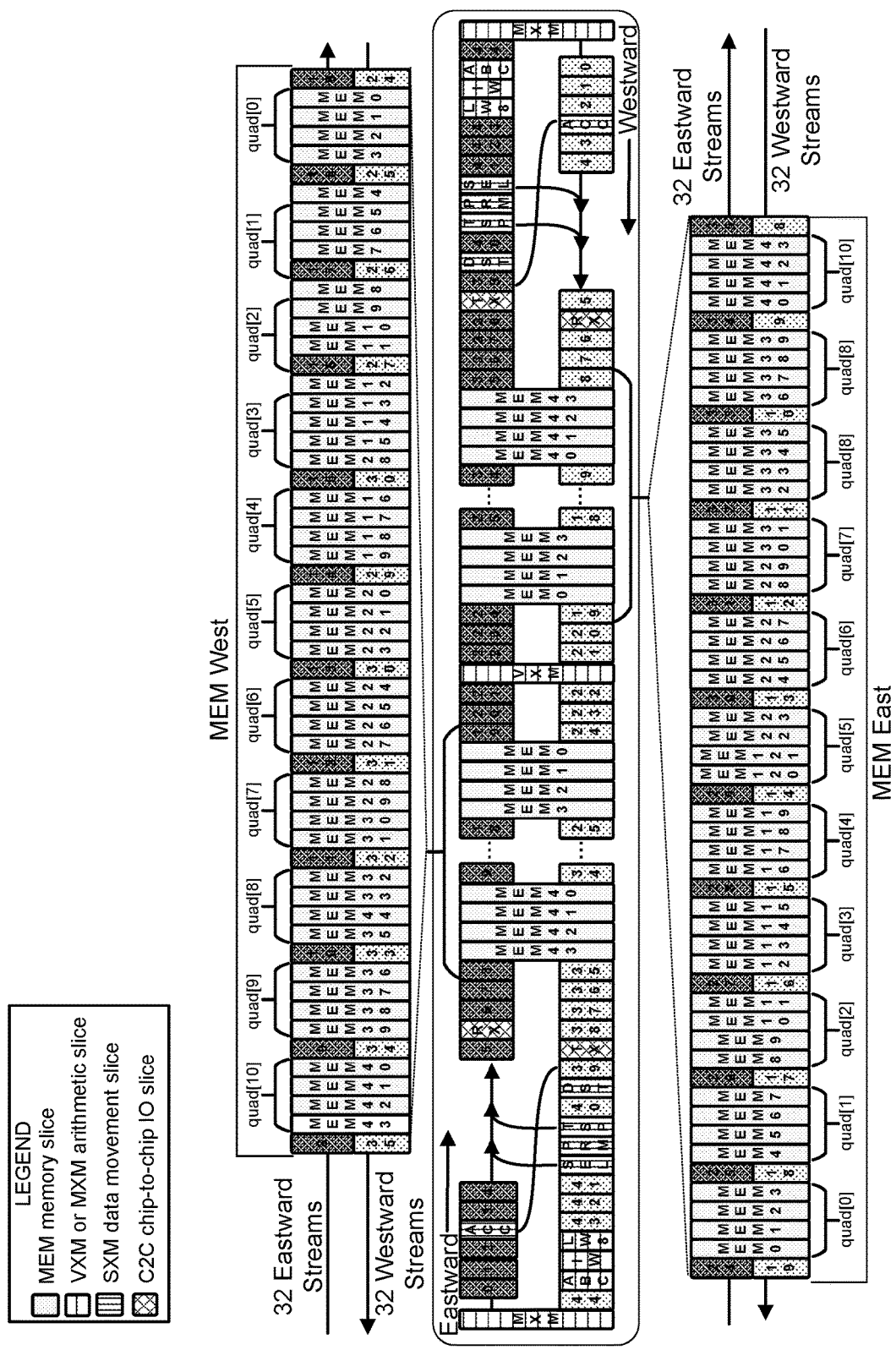
FIG. 6 depicts stream registers of the Groq TSP that are numbered to show their locations between the functional slices within a superlane, in accordance with some embodiments.

Streams are designated by both an identifier (0 . . . 31) and direction, for instance, in (28) designates stream 28 inward, and out (24) is stream 24 toward the outward edge of the chip. The direction of a stream may be designated as inward (toward the chip bisection) or outward (toward the outward edge of the chip), or the direction may be designated as Eastward or Westward, as shown in FIGS. 4 and 6.

The components of a superlane are organized spatially as shown in FIG. 4. The TSP's instruction set architecture (ISA) defines instructions spanning five different functional areas. The partitioned global address space (PGAS) presented by the MEM slices provides memory semantics for vectors to be addressed from SRAM and loaded into an architecturally visible stream with a direction of dataflow toward the functional slice intending to operate on them.

The first functional area (i.e., the ICU) provides explicit instruction fetching with IFetch instruction(s), and inter-slice synchronization using Sync and Notify instructions to perform a chip-wide barrier synchronization among participating functional slices. A repeated-NOP (no-op) instruction allows for precise cycle-by-cycle control of inter-instruction delay; for example, the compiler has cycle-accurate control when scheduling two operations A and B using an intervening NOP so that N cycles separate them, e.g., OpA NOP(N) OpB.

The second functional area (i.e., the VXM) consists of a 4×4 mesh of ALUs in each lane for point-wise arithmetic operations.

The third functional area (i.e., the MXM) consists of four independent 2D MAC arrays that operate on, e.g., INT8 or FP16 data types.

On-chip data movement uses the fourth functional area (i.e., the SXM) for intra-superlane and inter-lane switching by rearranging elements of vectors. The SXM is analogous to the NET interface to communicate between cores in FIG. 3. Together the MEM and SXM work in tandem to form the X-Y dimensions of the on-chip network.

The fifth functional area (i.e., the East and West hemisphere of on-chip MEM module) is composed of 44 parallel slices of SRAM and provides the memory access concurrency necessary to fully utilize the 32 streams in each East or West direction. Each slice provides 13-bits of physical addressing of 16-byte memory words, each byte maps to a lane, for a total of 220 MBytes of on-chip SRAM.

An additional sixth functional area includes the Chip-to-chip (C2C) modules configured to provide Send and Receive primitives for exchanging 320-byte vectors between a pair of chips. The first TSP implementation (see FIG. 5) has a total of 16×4 links operating at 30 Gbps each for a total off-chip bandwidth of 16×4×30 Gbps×2 directions=3.84 Tb/s (Tera-bytes per second) of off-chip pin bandwidth that can be flexibly partitioned to support high-radix interconnection networks of TSPs for large-scale systems. The host interface for peripheral component interconnect express (PCIe) Gen4 is also handled in this module. The host interface provides a lightweight direct memory access (DMA) engine to emplace a model onto the TSP memory and provides an entry point for bootstrapping the model execution. The host interface also provides a general mechanism for passing interrupts to the host, which may be necessary in the event a multi-bit memory error is observed, for example.

Table I provides a summary of example instructions for each functional slice, in accordance with some embodiments.

TABLE I

SUMMARY OF INSTRUCTIONS FOR EACH FUNCTIONAL SLICE

| | Instruction | Description |
|---|---|---|
| ICU | NOP N | No-operation, can be repeated N times to delay by N cycles |
| | Ifetch | Fetch instructions from streams or local memory |
| | Sync | Parks at the head of the instruction dispatch queue to await barrier notification |

TABLE I-continued

SUMMARY OF INSTRUCTIONS FOR EACH FUNCTIONAL SLICE

| | Instruction | Description |
|---|---|---|
| | Notify | Releases the pending barrier operations causing instruction flow to resume |
| | Config | Configure low-power mode |
| | Repeat n, d | Repeat the previous instruction n times, with d cycles between iterations |
| MEM | Read a, s | Load vector at address a onto stream s |
| | Write a, s | Store stream s register contents into main memory address a |
| | Gather s, map | Indirectly read addresses pointed to by map putting onto stream s |
| | Scatter s, map | Indirectly store stream s into address in the map stream |
| VXM | unary operation | $z = op\ x$ pointwise operation on 1 operand, x, producing 1 result, z (e.g., mask, negate) |
| | binary operation type | $z = x\ op\ y$ pointwise operations with 2 operands x and y producing 1 result, z (e.g., add, mul, sub) |
| | conversions | Converting fixed point to floating point, and vice versa |
| | ReLU | Rectified linear unit activation function max(0,x) |
| | TanH | Hyperbolic tangent - activation function |
| | Exp | Exponentiation $e^x$ |
| | RSqrt | Reciprocal square root |
| MXM | LW | Load weights (LW) from streams to weight buffer |
| | IW | Install weights (IW) from streams or LW buffer into the 320 × 320 array |
| | ABC | Activation buffer control (ABC) to initiate and coordinate arriving activations |
| | ACC | Accumulate (ACC) either INT32 or FP32 result from MXM |
| SXM | Shift up/down N | Lane-shift streams up/down by N lanes, and Select between North/South shifted vectors |
| | Permute map | Bijective permute 320 inputs $\xrightarrow{map}$ outputs |
| | Distribute map | Rearrange or replicate data within a superlane (16 lanes) |
| | Rotate stream | Rotate n × n input data to generate $n^2$ output streams with all possible rotations (n = 3 or n = 4) |
| | Transpose sg16 | Transpose 16 × 16 elements producing 16 output streams with rows and columns interchanged |
| C2C | Deskew | Manage skew across plesiochronous links |
| | Send | Send a 320-byte vector |
| | Receive | Receive a 320-byte vector, emplacing it in main memory |

A sequence of instructions performed on different functional slices can be chained to create more complex actions without the need to writeback intermediate results to memory. This allows efficient processing of streams at full bandwidth and lowest latency.

Parallel Streams Programming Model

Machine learning algorithms typically operate on vectors with coefficients of a specified data type (e.g., INT8, FP16, etc.). These vectors may be interpreted as an abstraction over the underlying data, whose elements can be processed by the same operation in a SIMD manner. The GROQ TSP operates on vectors, sometimes organized into rank-2 tensors, and relies on the graph-lowering compiler to transform higher rank tensors into rank-2 tensors.

The GROQ TSP's programming model is a producer-consumer model where each functional slice acts as a consumer and a producer of one or more streams. When a vector is read from main memory, the vector is given a stream identifier (0, . . . , 31) and direction: eastward, or westward. Once the vector is read into a stream register it is a stream and is "flowing" in the given direction in the following sense: given spatially adjacent functional slices at coordinates $x_0, x_1, x_2$ (where the spatial coordinate increases in the direction of flow), then at a given time $t_i$, the vector representing stream $s_1$ at slice $x_1$ can be accessed as operands by that slice. Similarly, the slices at $x_0$ and $x_2$ will have access to different stream values for the same stream register. In the following cycle $t_{i+1}$, the value $s_1$ either propagated to the functional slice at $x_2$, or else the value $s_1$ is overwritten with a result $r_1$ produced by the slice at $x_1$ at cycle t. Similarly, the stream value $s_0$ that was present to be consumed by the functional unit at coordinate $x_0$ at time $t_i$ will be (absent $x_0$ overwriting the value at time $t_i$) available in the next cycle $t_{i+1}$ to the slice at $x_1$. Stream operands are steered toward the slice that is consuming them and producing a result stream. Streams are constantly flowing across the chip, serving as how slices communicate with one another. FIG. 6 provides a graphical depiction of the interleaving of functional units and stream registers that combine to support this programming model.

Staggered Instruction Execution

Figure 7:
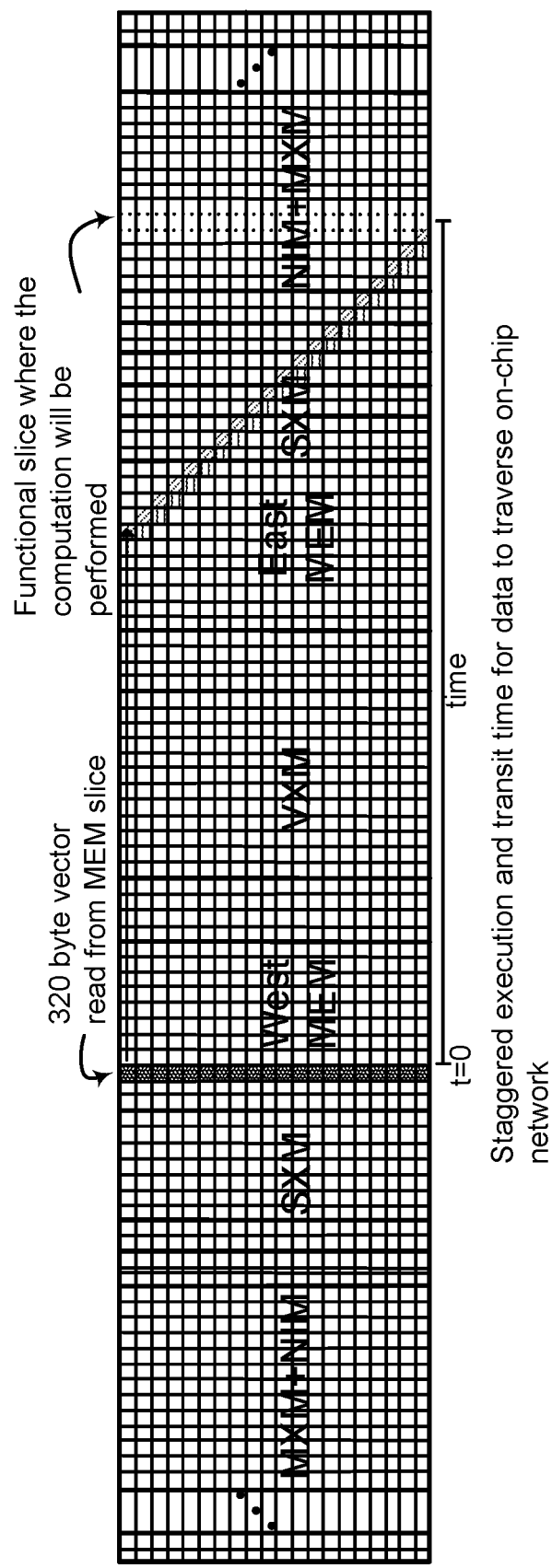
FIG. 7 illustrates a staggered instruction execution and dataflow within a superlane of the Groq TSP, in accordance with some embodiments.

In the TSP programming model, an instruction is issued on a functional slice at a given compiler-scheduled time t and executes as a SIMD operation on stream-supplied operand vectors (of up to 320-elements), producing vectors of the same length on result streams. At the micro-architectural level, the 320-element SIMD instruction is pipelined across the vertical stack of tiles in the slice. That is, at the scheduled time t the instruction will be issued to the bottom-most tile of the slice, (corresponding to the first 16-element superlane of operand/result vectors). In the subsequent cycle, the instruction will be propagated to the next tile northward in the slice, which in turn executes the instruction on the next 16-element super lane of operand vectors. This process continues cycle-by-cycle until the process has traversed all 20 tiles in the slice. The combination of vertical instruction pipelining described above, along with the need for operands and instructions to coincide at a precise time, results in a spatial "stagger" of SIMD operand and result data as depicted in FIG. 7. As shown, a single 320-byte vector is moving eastward along a stream.

On-Chip Memory

The on-chip memory supplies operands for each functional slice by reading an address from a MEM slice, denoted $MEM_i$. Memory is partitioned into two hemispheres (see FIG. 5), each having 44 slices numbered 0 to 43.

Slice $MEM_0$ is closest to the VXM and slice $MEM_{43}$ is nearest to the SXM. Each MEM slice comprises 20 tiles, arranged in a vertical stack, yielding a 2.5 Mibyte per-slice capacity, or 220 MiBytes for all 88 slices on-chip that provide the needed memory concurrency to supply 32 operands per lane, every cycle.

Slices of memory are partitioned into 16-byte words, each word spread across a superlane, and each byte of each word occupying a lane of an input channel or an output feature. That is, byte 0 is lane 0, byte 1 is lane 1, and so forth. Each tile produces a 16 portion of the vector, which is concatenated with the 16 elements from the adjacent tile beneath. Instructions execute in a cycle-by-cycle staggered manner across all 20 tiles in the slice: instructions flow Northward over the span of 20 cycles visiting each tile in the slice.

The MEM slices provide the programming abstraction of a partitioned global shared address space with the address space laid out uniformly across the 88 slices. Each MEM slice contains pseudo-dual-port SRAMs that can service a pair of read and write requests simultaneously assuming they are not targeting the same bank. As such, the bank bit is exposed so that the compiler can manage the underlying SRAM efficiently and appropriately. This allows the compiler to take advantage of all 88 slices in 176-way memory concurrency—88 slices each with 2 banks—to read operands to or store results from streams.

To maximize stream concurrency, the compiler allocates memory for a tensor's concurrent stream operands into separate MEM slices—as streams propagate through the MEM slices, they "pick up" operands from the MEM slices enroute to the MXM. This fine-grain memory management required that the various levels of memory concurrency are exposed in the ISA allowing the compiler to explicitly schedule individual banks in each MEM slice.

In an embodiment of the present disclosure, operands are simultaneously read from one bank and results are written to the other bank in the same slice.

Conventional CPUs rely on a memory hierarchy to implicitly move data between caches to service load/store operations. Cache hierarchies introduce a reactive agent in the data path that causes the undesired unpredictability, or non-determinism, in the data path to provide the illusion of sequentially consistent memory transactions within the memory hierarchy.

Unlike a conventional CPU, the GROQ TSP's MEM system provides a thin layer of memory management that is used to identify memory concurrency on an operation-by-operation basis.

Near-Compute Off-Chip Memory

The performance of computer systems is often limited by the bandwidth of the memory channels, but further increasing the bandwidth is challenging under the stringent pin and power constraints of packages. To further increase performance under these constraints, various processing-in-memory (or function-in-memory) architectures, which tightly integrate processing functions have been proposed, e.g., with dynamic random-access memory (DRAM) devices using two-and-a-half dimensional (2.5D) and/or three-dimensional (3D) stacking technology.

In one embodiment, the GROQ TSP architecture offers new memory solutions to satisfy the need to process continuously increasing amounts of data needed to implement the modern artificial intelligence (AI) systems.

Figure 8:
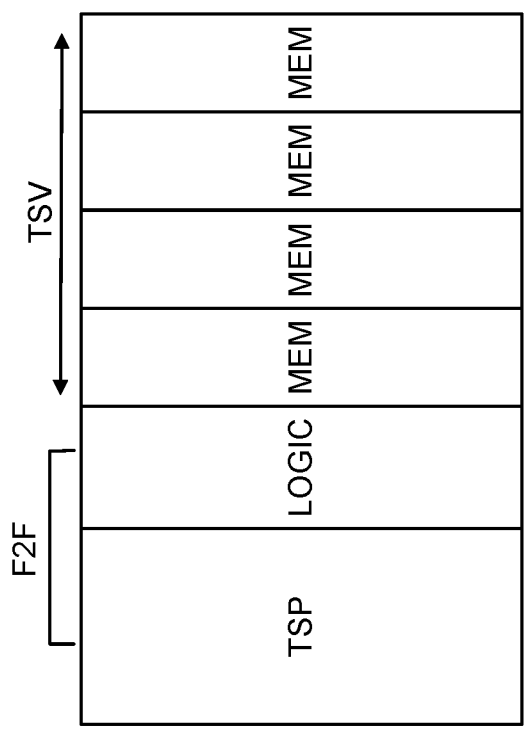
FIG. 8 depicts Face-To-Face (F2F) embodiment of an off-chip near-compute memory connecting two TSP chips using Through-Silicon-Via (TSV) for the Groq TSP, in accordance with some embodiments.

In an embodiment of the present disclosure, FIG. 8 depicts a Face-To-Face (F2F) off chip near-compute memory connecting two TSP chips using Through-Silicon-Via (TSV) technology. The memory component is not limited to DRAM but may include SRAM or other non-volatile memory (NVM) such as 3D NOR memory, NAND memory, FLASH memory, 3D Crosspoint memory (phase change memory available from Micron Technology), a next-generation ferroelectric memory, or a Nanotube RAM.

A logic die comprises row buffers for interfacing the TSP to the DRAM component (not shown). The DRAM component also has an array core and a row decoder. During a read operation of the DRAM component, the row decoder selects a row of array core and the entire row from the selected row is transferred from the DRAM component to row buffers on the logic die. It is important to note that the DRAM component does not include column decoders because the system reads and writes an entire row during each R/W cycle. The logic die is preferably, in one embodiment, coupled to DRAM banks by TSV and coupled to the TSP in a F2F configuration.

In one embodiment, the memory plane comprises a 3D NOR memory having conductors layered on top of, and directly coupled to, the face of the logic plane. In this embodiment, the logic plane is coupled to the processor plane by at least one TSV. This type of memory may be stacked directly on top of either the logic plane or the processor plane.

The processor plane and the logic plane, in one embodiment, are positioned in a F2F relationship using wafer stacking technology. More specifically, wafers having the processor plane logic are fused with wafers having the logic plane preferably using known wafer bonding and thinning techniques. The Van der Waal forces are relied upon to ensure electrical connection between the wafers keeping the conductors on different wafers in physical contact. In this embodiment, the memory plane is coupled to the logic using a plurality of TSVs.

Figure 9A:
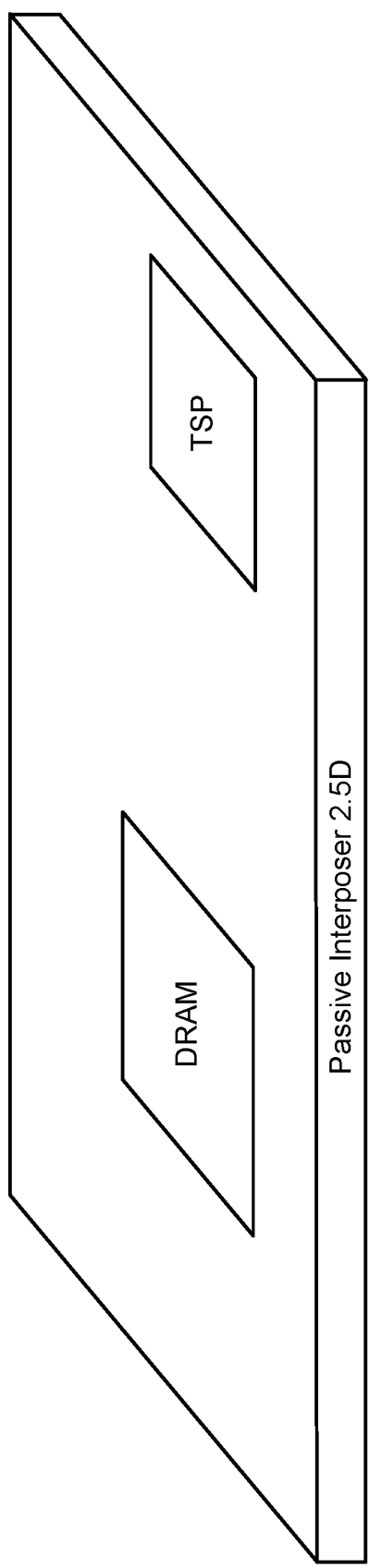
FIG. 9A illustrates a single Groq TSP chip connected to an off-chip near-compute dynamic random-access memory (DRAM) using a passive interposer in two-and-a-half dimensional (2.5D) configuration, in accordance with some embodiments.

In an embodiment of the present disclosure, FIG. 9A shows a single TSP chip connected to an off-chip near-compute DRAM using a passive interposer in 2.5D configuration. The passive 2.5D interposer plane includes the electrical connections between the TSP and DRAM.

Figure 9B:
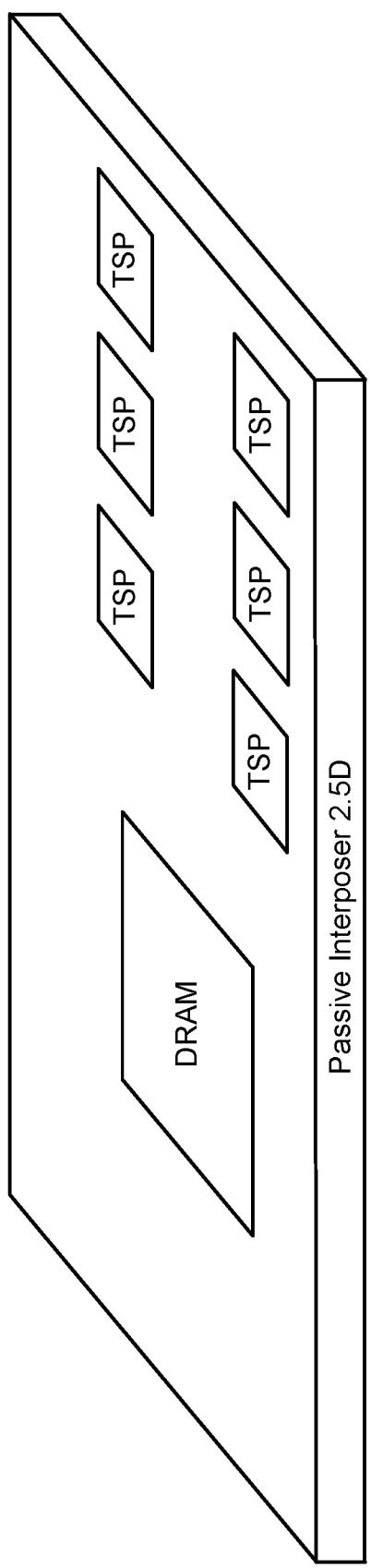
FIG. 9B shows a plurality of Groq TSP chips connected to an off-chip near-compute DRAM using a passive interposer in 2.5D configuration, in accordance with some embodiments.

In an embodiment of the present disclosure, FIG. 9B depicts a plurality of TSP chips connected to an off-chip near-compute DRAM using passive interposer in 2.5D configuration.

Figure 10A:
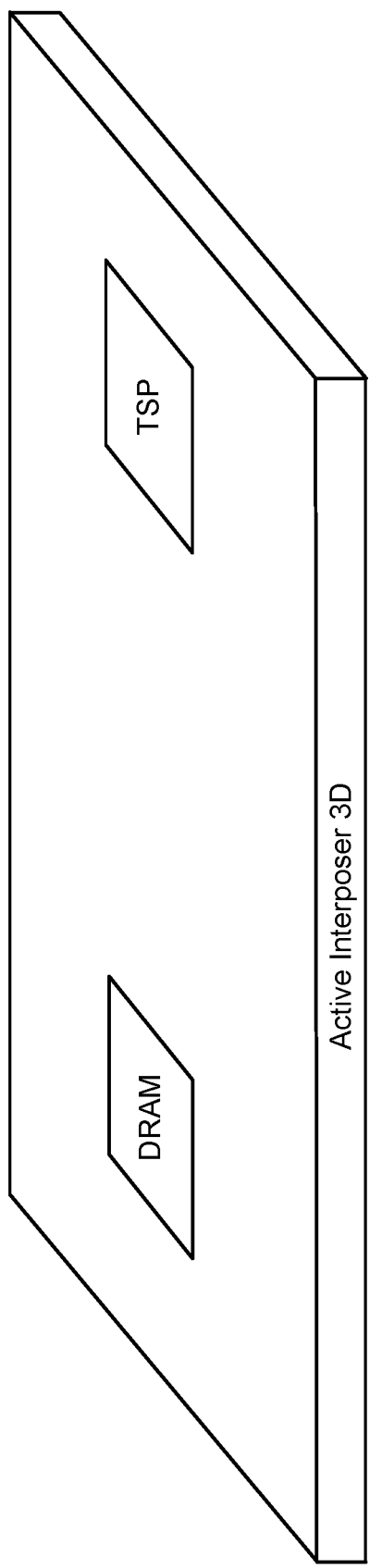
FIG. 10A illustrates a single Groq TSP chip connected to an off-chip near-compute DRAM using an active interposer in three-dimensional (3D) configuration, in accordance with some embodiments.

In an embodiment of the present disclosure, FIG. 10A illustrates a single TSP chip connected to an off-chip near-compute DRAM using an active interposer in a 3D configuration. Active 3D interposer includes a plurality of SRAM blocks in addition to electrical connections between TSP, SRAM blocks, and DRAM.

In an embodiment of the present disclosure, FIG. 10A shows a plurality of TSP chips connected to an off-chip near-compute DRAM using an active interposer in 3D configuration. The active 3D interposer includes a plurality of SRAM blocks in addition to an electrical connection between TSP, SRAM blocks, and DRAM.

The term 'near compute' means that the off-chip memory, whether DRAM or NVM, logically operates with massive bandwidth, deterministic access time and global address space and performs similar to the on-chip SRAM. The off-chip memory has a global address space accessible by the processor. Near compute memory includes techniques that provide massive interconnect capacity that is under control of the processor.

Figure 11A:
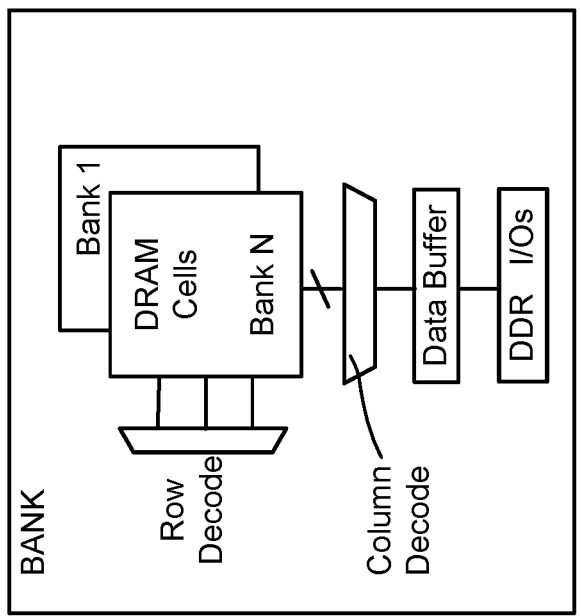
FIG. 11A depicts the prior art DRAM architecture.

FIG. 11A depicts the prior art DRAM architecture. This architecture has limited functionality for use as a cache or near compute memory for a non-deterministic processor because of the low RTR.

The TSP architecture being deterministic makes the memory access pattern also deterministic—that is, there is no need for high RTR memory. This allows for use of low random transaction rate (RTR) memories (e.g., DRAM banks etc.) as near-compute memory. Advantageously, multiple DRAM banks accessed concurrently provide the performance equivalence of a high RTR memory.

In one embodiment, FIG. 11B illustrates the memory architecture for a processor that is configured for a concurrent global access to multiple banks of a memory array simultaneously.

In one embodiment, the memory array comprises banks of DRAM of more than four banks. Typically, such banks are preferably manufactured at a different process node than the logic die or the processor die to take advantage of process node parameters that provide the best power, area and performance for each die.

To get the requisite bandwidth to feed the compute units on a TSP, the memory enables multiple banks to be active simultaneously.

Most of the power in traditional DRAM access is spent data path traversal and input/output (I/O) paths.

In the present embodiment, implementing a near-compute RTR memory with a global concurrent address space results in a significantly reduced power consumption and significantly reduced power dissipation in the TSP chip. Indeed, placing low RTR (for example, DRAM) near-compute memory in close proximity to the processor minimizes the consumed power as it minimizes the distance the signals must travel compared to the traditional DRAM—processor topology. One reason power is minimized is that the short traces present a lower capacitive loading. Another reason is that the short traces require fewer buffers to ensure signal integrity. Yet another reason is that since there is less logic on the memory integrated circuit devices, there is less heat which would otherwise cause an increase in resistance as junction temperatures increased.

Global memory access is facilitated among the superlanes by using SXM modules (of FIG. 4) to provide an inter-lane switching mechanism to allow any computing element (MXM or VXM) from any superlane access to any requested data residing in any bank memory element in either the RTR memory or the on-chip SRAM banks.

More specifically, the SXM contains several functions for transposition, permutation, shifting and rotation of data elements. Collectively, these operations are used for performing tensor reshape operations common to ML workloads, and fulfill the functionality of the NET slice in FIG. 3. Data movement on-chip is carried out by routing data in two dimensions: horizontally propagating streams in the X-dimension shuttling between SRAM and functional units within each superlane using the stream registers, and vertically in the Y-dimension where the SXM is used to move data in the North-South directions.

Figure 12:
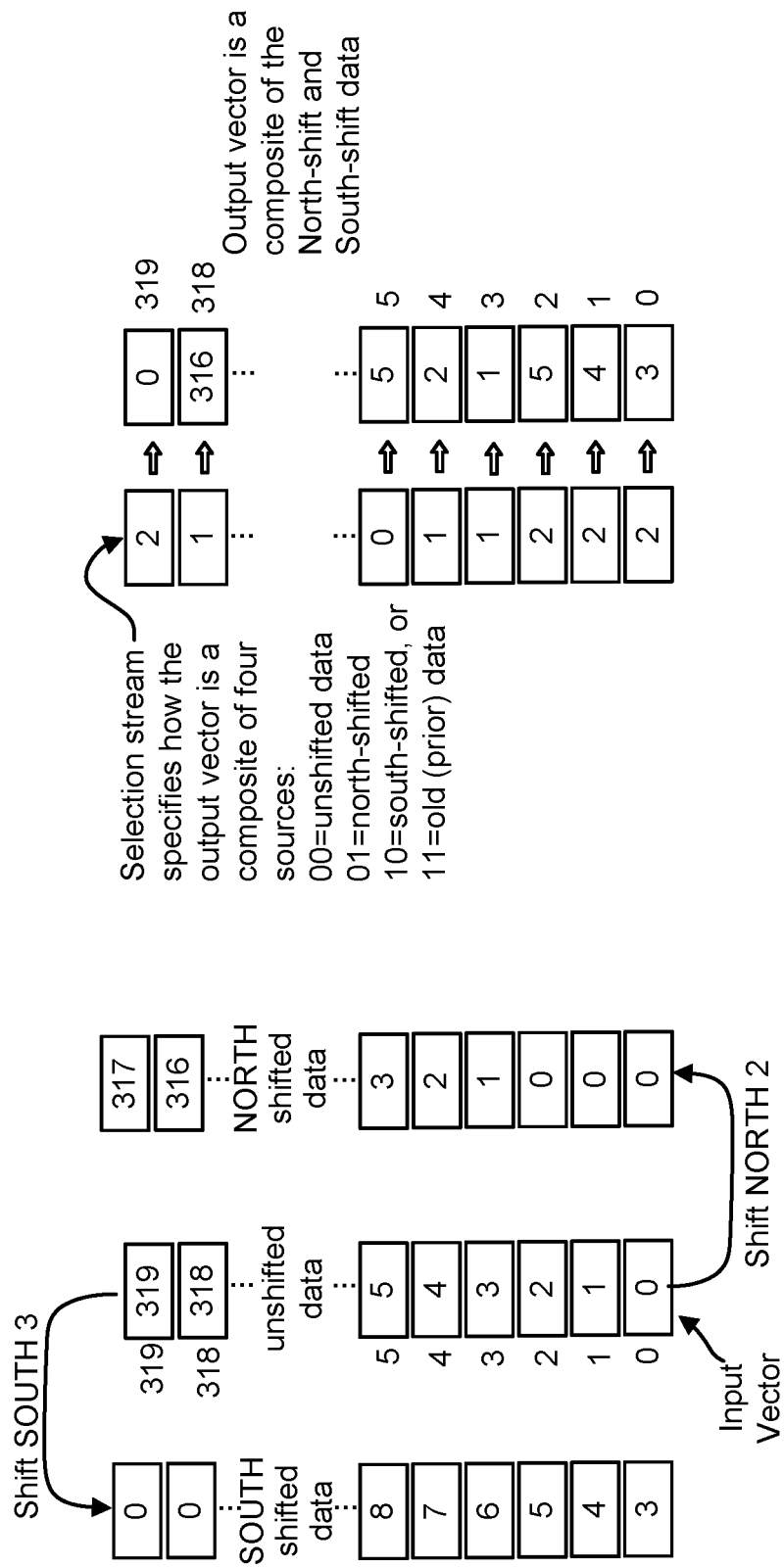
FIG. 12 depicts the switch execution module (SXM) in the TSP chip providing a combination of North (up) and South (down) shifting operations which can be combined using the select command, in accordance with some embodiments.

The SXM provides two sets of lane shifters that execute shift instructions for both North and South. The lane-shifters are usually allocated in pairs since a vector is typically shifted up or down and desired elements are selected from either (i) North-shifted, (ii) South-shifted, or (iii) unshifted data elements, as shown in more detail in FIG. 12. In addition, the SXM provides a permute instruction which employs a programmed bijection to remap the 320 lanes on a set of similarly indexed streams, one per superlane.

The distributor slice within the SXM is used to arbitrarily remap the 16 lanes within each superlane. As streams pass through the distributor, they can be remapped at full bandwidth, or zero-fill any or all the 16 elements. This provides a very efficient mechanism for common tensor operations like zero padding or rearranging elements of a 4×4 filter.

Transposing the dimensions of a tensor is a quite common operation on tensor data types. The TSP supports a two-dimension transpose of 256 elements organized as 16 streams each with 16 elements. A transpose operation takes 16 incoming streams and produces 16 output streams with the rows and columns exchanged. This allows the TSP to efficiently move data from the 16-byte MEM word into 16 different MEM slices where they are now addressable. There are two instances of the SXM on-chip, one in each hemisphere (see FIG. 5). Each can issue two transpose instructions, thus yielding a maximum of four simultaneous transpose 16×16 operations.

DRAM Architecture Embodiment

FIG. 13 illustrates an embodiment illustrating a DRAM architecture compatible for use with a TSP configuration where on-chip memory is minimized on the TSP die so that compute resources can be expanded, or the chip size reduced. With less on-chip memory, which is preferably SRAM, the DRAM component provides the near compute memory.

Figure 14:
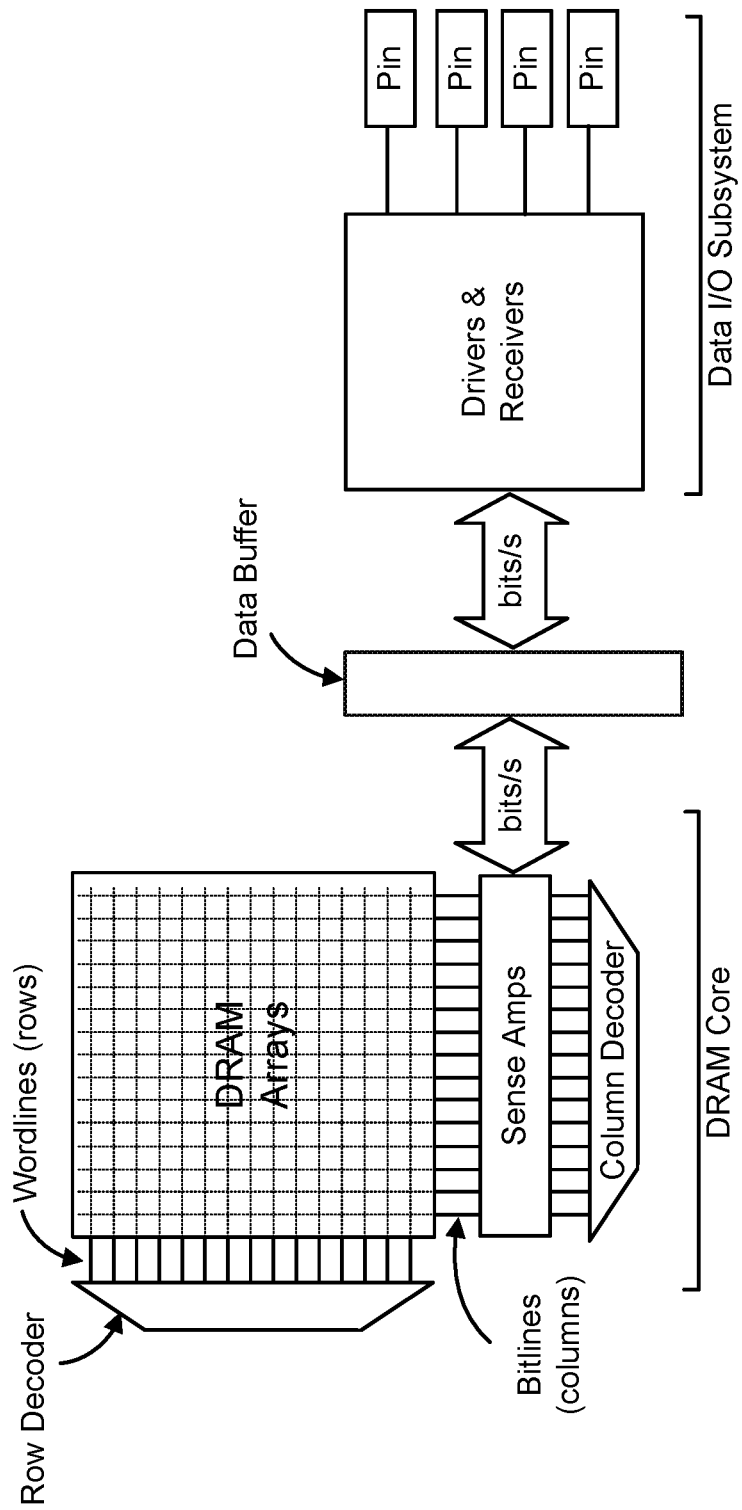
FIG. 14 depicts the global access to DRAM core from TSP chip via a plurality of pins of data input/output (I/O) subsystem configuration, in accordance with some embodiments.
Figure 15:
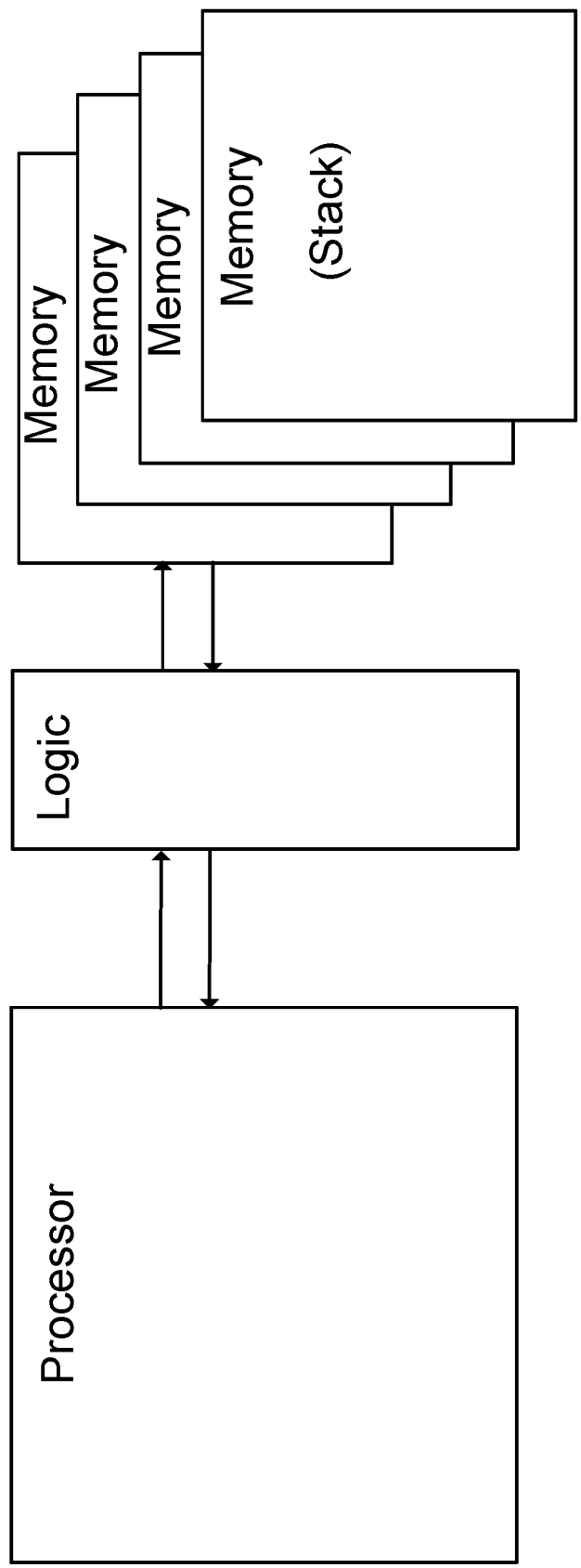
FIG. 15 is an example showing an integrated processor die instance arranged to fit in a multi-chip module (MCM) package, where processor die instance is assembled face-to-face with a memory die, in accordance with some embodiments.

FIG. 14 illustrates a method for coupling high-capacity memory to the deterministically scheduled, high bandwidth global data path on the TSP. The global access to DRAM from the TSP chip is provided via a plurality of pins on a data I/O subsystem.

The number of data bits in the data buffer need not be equal to the number of data pins, and having a buffer that is two times, four times, or eight times wider than the number of data pins (or more) allows to increase the data rates two times, four times, eight times, or more.

To better understand the interaction between TSP and off-chip DRAM, the functioning of the on-chip SRAM is reviewed.

The on-chip SRAM supplies operands for each functional slice by reading an address from a MEM slice, denoted $MEM_i$. Memory is partitioned into two hemispheres (see FIG. 5), each having 44 slices numbered 0 to 43.

Slice $MEM_0$ is closest to the VXM and $MEM_{43}$ is nearest to the SXM. Each MEM slice comprises 20 tiles, arranged in a vertical stack, yielding a 2.5 Mibyte per-slice capacity, or 220 MiBytes for all 88 slices on-chip.

The 88 slices provide the memory concurrency to supply 32 operands per lane, every cycle. Slices of memory are partitioned into 16-byte words, each word spread across a superlane, and each byte of each word occupying a lane of an input channel or an output feature. That is, byte 0 is lane 0, byte 1 is lane 1, and so forth. Each tile produces a 16 portion of the vector, which is concatenated with the 16 elements from the adjacent tile beneath. Instructions execute in a cycle-by-cycle staggered manner across all 20 tiles in the slice (as shown in FIG. 7) and instructions flow Northward over the span of 20 cycles visiting each tile in the slice.

For an example, 1 GHz operating frequency of the core clock can be assumed. The stream register bandwidth, B, exported by each MEM interface on the east and west edge of each MEM hemisphere can keep the functional units adequately fed with data operands to saturate the peak arithmetic capacity of the functional units. The stream registers provide a combined capacity of 20 TiB/s of read (operand) and write (result) bandwidth, as shown in Equation 1.

Thus, for stream registers, the required bandwidth is:

$$B = 10^9/\text{sec} \times 2 \text{ directions} \times 32 \text{ bytes/lane} \times 320 \text{ lanes} = 20 \text{ TiB/s}. \quad \text{(Eq. 1)}$$

Note that one TiB (Tebibyte) contains 1024 bytes, which is the same as a binary terabyte. TiB is similar but not equal to the common terabyte, i.e., 1 TiB=1.09951 Terabyte.

Since the SRAM banks are shuttling data between the stream registers and SRAM cells, the SRAM bandwidth, M, must exceed the stream bandwidth B. The SRAM bandwidth of on-chip memory is given in Equation 2.

$$M = 10^9/\text{sec} \times 2 \text{ hem} \times 44 \text{ slices/hem} \times 2 \text{ banks/slice} \times 320 \text{ bytes/cycle} = 55 \text{ TiB/s}. \quad \text{(Eq. 2)}$$

Thus, the memory bandwidth of 55 TiB/s is obtained for on-chip memory with capacity of 220 MiBytes for all 88 slices on-chip, or 27.5 TiB/sec of SRAM bandwidth in each hemisphere using only SRAM.

Instruction fetching consumes a maximum SRAM bandwidth of 144×16, or 2.1 TiB/s of maximum instruction fetch bandwidth. Each MEM hemisphere exports 20 TiB/s of stream bandwidth from its 25.61 TiB/s of SRAM bandwidth, which satisfies the maximum instruction issue rate of 2.1 TiB/s across all functional slices. With 5.61 TiB/s of SRAM bandwidth and 2.1 TiB/s of instruction fetch bandwidth, this still leaves 25 TiB/s of SRAM bandwidth from which to service 18.63 TiB/s of stream register bandwidth for operands and results.

If an off-chip near-compute DRAM is attached to the TSP chip, as illustrated in FIG. 14, each DRAM bank provides 1 KiB per row at 40 ns clock cycle. The row data can be put on the stream directly or can be read into a 1 KB Registerfile/SRAM buffer on the TSP or the interposer for supporting similar access/use pattern as it is done in the current embodiment of SRAM access.

The 55 TiB/s of on chip memory bandwidth for on-chip memory (as calculated in Eq. 2) can be compared with capacity of 220 MiBytes for all 88 slices on-chip, with a single off-chip near-compute DRAM die that results in 32 GB memory capacity with bandwidth of about 256 TiB/s. Thus, there is a substantial improvement in both memory capacity and bandwidth.

Figure 10B:
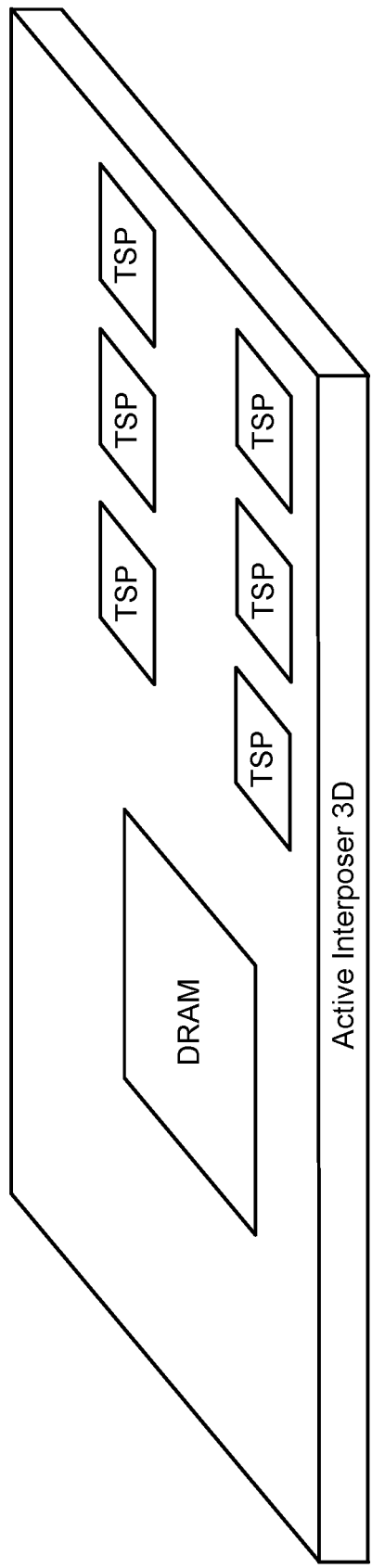
FIG. 10B shows a plurality of Groq TSP chips connected to an off-chip near-compute DRAM using an active interposer in 3D configuration, in accordance with some embodiments.

The single DRAM memory can be attached to a TSP chip using either interposer embodiment, i.e., passive interposer (FIGS. 9A-9B) or active interposer (FIGS. 10A-10B). Using interposer embodiments, at least one off-chip near-compute DRAM can be attached to multiple TSP chips. In other embodiments, multiple DRAM die may be stacked and attached or coupled to multiple TSP chips using either passive or active interposers.

In one embodiment, a low power version of a DRAM is shown in FIG. 14. Here, sense amps are attached directly to row I/O and there is no need for either a logic layer or data buffers.

In one embodiment, SRAM on the TSP or an interposer is used as a buffer. If this is the case, the row contents may be spread across multiple SRAM macros to enable concurrent SRAM loading.

Ecosystem

In the prior art, each row read in the DRAM is destructive as it requires a read and a write back of the same contents to the row when closing the row.

In one embodiment of the present disclosure, given that the TSP is deterministic, each row read in the DRAM is not destructive as each row can write new data if aligned with a closing row. This enables enhanced performance while lowering power.

Similarly, the prior art DRAM requires a refresh of row contents at periodic intervals.

In one embodiment of the present disclosure, given that the TSP is deterministic, the TSP can deterministically write either new data or refresh existing data to the row of the DRAM. This enables higher write bandwidth and better management of refresh function. Refresh function with new data requires access to DRAM write register loaded with new data.

Certain embodiments of the present disclosure relate to a deterministic near-compute memory apparatus comprising at least one processor having a single core deterministic processor, and an off-chip deterministic near-compute memory unit (e.g., DRAM) communicatively coupled with and placed within a defined vicinity from the TSP. The off-chip deterministic near-compute memory unit comprises a plurality of data banks having a common global memory access, a common control bus, and a common data output bus.

In one embodiment, the single core deterministic processor is configured to initiate, via the common control bus, retrieval of a set of data (e.g., rows of data) from the plurality of data banks using the common global memory access, the retrieved set of data passed via the common data output bus onto at least one stream register of the TSP.

By accessing rows of data from the off-chip deterministic near-compute memory unit onto the at least one stream register of the TSP in a deterministic manner, the off-chip deterministic near-compute memory unit does not require a column decoder as the TSP accesses rows only. With the deterministic architecture of the off-chip memory, the TSP can load up stream register(s) from the off-chip memory a predetermined time period before the set of data is required to arrive at compute element(s) of the TSP. Thus, advantageously, the off-chip deterministic near-compute memory unit can be implemented as a slow dense memory that is cheaper to run as a latency can be managed by the compiler and a bandwidth can be increased by increasing several rows that can be simultaneously accessed at the off-chip memory to feed superlanes of the TSP.

The TSP comprises a plurality of tiles, wherein each tile is configured for a specific compute function and is stacked into a corresponding slice in a first dimension of a 2D on-chip mesh of the TSP. A first subset of the tiles is stacked into a VXM slice, the VXM slice comprising a plurality of ALUs configured for one or more point-wise arithmetic operations. A second subset of the tiles is stacked into a MXM slice, the MXM slice comprising a plurality of 2D MACC arrays configured to operate on integer or floating-point data types. A third subset of the tiles is stacked into a SXM slice configured to enable an on-chip data movement by rearranging elements of vectors. A fourth subset of the tiles is stacked into an East and West hemisphere of an on-chip internal MEM module comprising a plurality of parallel slices of a SRAM and configured to provide memory access concurrency for a plurality of data streams flowing in an East direction toward the East hemisphere or, alternatively in an West direction toward the West hemisphere. A fifth subset of the tiles is stacked into an inter-slice ICU configured to provide explicit instruction fetching with a fetch instruction, and inter-slice synchronization using sync and notify instructions to perform a chip-wide barrier synchronization among participating slices, wherein a repeated-NOP (no-op) instruction allows for precise cycle-by-cycle control of an inter-instruction delay. The MEM module may reserve several MEM slices to serve as instruction-dispatch slices where machine-coded instructions are stored and supplied on streams to service fetch instructions on different slices where the instructions are executed.

The off-chip deterministic near-compute memory unit includes a row buffer for storing write operations, the row buffer configured to delay the write operations to the off-chip deterministic near-compute memory unit. The plurality of data banks of the off-chip deterministic near-compute memory unit is configured to simultaneously retrieve the set of data directly into the row buffer. At least one stream register of the TSP is configured to have the set of data from the row buffer loaded with a direction of dataflow toward a slice intending to operate on the requested set of data on a next clock cycle under one or more instructions initiated by the TSP.

In some embodiments, the common global memory access to the off-chip deterministic near-compute memory unit comprises a plurality of SXMs to provide an inter-lane switching mechanism for allowing any computing element of the TSP from any superlane access to any requested data residing either on the off-chip deterministic near-compute memory unit or residing on a plurality of SRAM banks. The data banks the off-chip deterministic near-compute memory unit may be configured to be concurrently accessible by different computing units of the TSP. A level of memory concurrency for a plurality of data streams in the TSP in each of an East and a West direction may be limited by a power supply configuration of the deterministic near-compute memory apparatus and by a power dissipation configured to prevent an excessive heating of the deterministic near-compute memory apparatus.

In some embodiments, a high RTR memory is part of the off-chip deterministic near-compute memory unit. In such cases, a plurality of concurrent data lines of the common data output bus couples the TSP with the high RTR memory for passing the retrieved set of data from the high RTR memory to the at least one stream register of the TSP.

Given the deterministic access pattern, the TSP can also treat the off-chip deterministic near-compute memory unit (e.g., DRAM) as a circular read/write access medium having an opportunity to read and write every row location. A row address line of the off-chip deterministic near-compute memory unit is coupled to a clock. The row address line is configured to receive a row address from the TSP and increment every clock cycle in accordance with the circular medium access until the row address loops back without explicit addressing. This pattern allows for even further power reduction and performance improvement while implicitly incorporating refresh support.

In some embodiments, TSP includes a plurality of SRAM banks configured to shuttle data between the at least one stream register of the TSP and the SRAM banks, wherein a bandwidth associated with the SRAM banks exceeds a bandwidth associated with the at least one stream register.

Architecture and Usage Optimizations for Lower Power and Higher Density SRAM

The above-referenced concepts can be also used to increase the density while also reducing power and area/MB for SRAM whether on the TSP die or on an active interposer.

More specifically, instead of using x128b high performance (1-2 GHz) macros, the on-die SRAM is, in one embodiment, organized as a wider word (e.g., approximately 1 KB) macro running at lower speed (e.g., 500 MHz) and thereby allowing for higher density/mm2 and lower power as well. The output is then read directly onto the streams or into a Register File or SRAM buffer(s).

Additional Related Disclosure

The deterministic near-compute memory for deterministic processor disclosed above enhances data movement between memory units and processing units. Referring now to the disclosure in more detail, in computer systems, low latency access to memory is important for processor architectures because the performance of the system is better when the latency is low. Dense memory devices physically disposed within a defined vicinity from the processor devices help minimize communication delays that are larger when the distances separating the memory device from the processor device are larger. It is a benefit of the embodiments described in this disclosure that the physical distance between memory and processor devices is reduced, and communication latency is reduced.

In addition to improved system performance, a further benefit of the embodiments described in this disclosure is that when sufficient memory with low latency and high bandwidth is available to the processor configured per this disclosure, there is a reduced need to have memory integrated with the processor. This leads to enhancement of the data movement between memory units and processing units.

The prior art processor devices often integrate fast memory banks, such as SRAM, cache memory in one or more hierarchical levels, non-volatile memory, embedded or non-embedded DRAM, etc.

A reduced need for such integrated memory elements expands opportunities for other improvements in the compute performance or cost of the processor device. The key characteristic of this disclosure is enabling a high transaction rate between dense near-compute memory and processor elements configured to improve performance, even when implemented in the context of the counter-intuitive aspect of reducing the amount of memory integrated with the processor device.

As was stated above, a measure of the performance of the memory to processor interface is a RTR, which is a measure of the degree of randomness in memory transactions. The RTR represents a number of random memory addresses issued per unit time to a memory element or subsystem.

For exemplary purposes, an example of this disclosure described above was based on a particular type of memory, i.e., DRAM. The disclosure applies however to any type of memory and the use of DRAM in this example is only to facilitate the description of the disclosure.

DRAM banks generally have a low RTR when interfaced through conventional external interface channels, even though internal to the DRAM module there are wide rows of data that could allow for high RTR under appropriate conditions. The low RTR of DRAM between row accesses can be accommodated in the prior art computer system by a compiler that optimizes the sequence of read and write operations to aggregate them as much as possible into a smaller number of row accesses.

However, as was explained in the above embodiments, the off-chip near-compute DRAM includes a high RTR row due to large number of multiple concurrent row accesses between TSP and DRAM.

As an example of an embodiment of this disclosure, a processor die connected face-to-face with a DRAM die could achieve massive data bandwidth on the order of five trillion bits per second per square millimeter (5 TiB/s/mm$^2$). By way of example, the TSV interconnect could be a direct copper-to-copper bonding which would enable approximately 200 times higher interconnect density compared to regular 2D packaging, a more than 15 times density increase compared to micro-bump technology, and more than three times better interconnect efficiency compared to micro-bumps. The TSV interface may be a direct die-to-die copper interconnect which is a very flexible 'active-on-active' chip stacking technology.

As was disclosed above, the embodiments described in this disclosure dramatically reduce the data path overhead to access DRAM, increasing the bandwidth and accessible memory density. The compiler can sequence memory accesses to maximize the benefit of high RTR row access within the DRAM module.

In one embodiment, there is one DRAM die mated to a processor die in a sandwich, with one or more of the DRAM/processors die sandwiches stacked on top of each other to provide extremely high computational density in a package. In another embodiment of this disclosure, a stack of DRAM die is mated to a processor, and then one or more of these stacks could be stacked together in a single package.

Processor architectures benefit the most from the embodiments described in this disclosure when they are configured to use DRAM as the local memory.

Embodiments of this disclosure are more efficient when memory read and write access are sequenced to best utilize the high RTR properties of the row data arrangement in the DRAM module.

Power requirements are lower with embodiments described in this disclosure because the data buffer routing lines are shorter. The area used on a processor die for embedded cache or SRAM storage can be significantly reduced with embodiments described in this disclosure. This reduction of area continues to be increasingly important because in newer process nodes the area of memory devices tends to shrink slower than the area of logic or computation devices, causing the memory to be an ever-larger proportion of the total processor die size.

The disclosure thus provides a substantial cost benefit which has even greater importance in market segments where products require larger amounts of memory for the required level of system performance.

In a process technology where two dies can be connected in a face-to-face arrangement with connections at a 5-micron pitch, the bandwidth available between the die can be up to 5 TiB/s/mm$^2$. In more advanced process nodes where the pitch is one micron, the bandwidth would be 125 TiB/s/mm$^2$.

As shown in FIG. 14, the architecture of DRAM includes arrays of storage bits with bit line columns that terminate in sense amps that are usually integrated on the same die as the storage bit array.

In some configurations (not shown), several DRAM dies with storage arrays are connected to share the sense amps which are located on only one die out of the set.

Bit line columns in DRAM banks can be multiplexed, which reduces the height of the array and increases the width. Bit line multiplexing may be done to alter the aspect ratio of DRAM banks for topological or manufacturing reasons. In the context of the embodiments described in this disclosure, the increased number of bit line columns increases the bandwidth available at the interface to the processor chip.

Manufacturing improvements in the semiconductor fabrication lines used to produce DRAM chips continue to increase density and lower costs without the hindrances that limit scalability for SRAMs. Even using the same interface arrangement for the processor, the available memory density will increase as DRAM manufacturing continues to improve.

The location of the row buffer can be important for the embodiments described in this disclosure.

In one embodiment, the processor chip would be customized to interface in a stack with one or more DRAM die, like the disposition of die in a High Bandwidth Memory (HBM) stack. In this configuration, the DRAM die would be the same as previously, with communication through the HBM edge interface.

F2F connections are preferable to face-to-back (F2B) and back-to-back connections (B2B) because for F2B and B2B chip stacking, because F2F connections provide an opportunity for lower impedance connections. Power distribution networks require supply paths to be low impedance, typically much less than one ohm.

Thus, in one embodiment, the processor and DRAM die layouts is customized to enable F2F connections instead of F2B connections.

In an embodiment of the present disclosure, with HBM memory chips stacked on top of a processor die, there may be sense amps only on a logic chip that is included in the stack, in a location such as between the DRAM die and the processor chip. The DRAM die in this stack would have only arrays of data bit storage cells.

In an alternative embodiment, sense amps could be integrated into the processor chip, making the logic chip unnecessary.

In yet another embodiment, there may be an SRAM buffer located in the logic chip.

Each of these different embodiments offers certain advantages. For example, manufacturing testability may be easier if the logic chip is included in the stack because all memory in the stack could be tested in place before the processor is attached.

The cost of the logic chip may be lower than other die of the same area because the logic chip may be manufactured using older, lower cost fabrication technology. Without the embodiments described in this disclosure, the logic chip is generally not connected to the DRAM in a F2F disposition; usually the logic chip is connected F2B or B2B using TSV structures. In embodiments where the processor subsumes the logic chip functionality, it is especially beneficial to connect the processor to the DRAM die in a F2F disposition.

In a processor-memory configuration, the system bandwidth is not limited by DRAM banks access bandwidth. DRAM banks typically runs at 200 to 300 MHz. The bandwidth limiter is the delay between the sense amp and the data buffer (FIG. 14).

For stacks of 8- or 15-DRAM dies, by way of example, the primary bandwidth limiting factor is the available TSV bandwidth, not the F2F bandwidth. The embodiments described in this disclosure do not require improvements in the DRAM external interface, and the embodiments described in this disclosure do not require increased number of TSV structures.

Instead, the embodiments described in this disclosure benefit from wider row buffers with the logic chip driving the TSVs.

In one embodiment, the logic chip is typically implemented using older generation process technology, so the logic chip is inexpensive, and it may be desirable to use the logic chip in conjunction with the processor chip in some embodiments.

In one embodiment, the logic chip functions may be integrated into the processor chip.

In one embodiment, there are banks and sense amplifiers placed on every memory die.

In one embodiment, the sense amplifiers are located only on the logic die.

In one embodiment, the sense amplifiers are placed on the processor die.

In one embodiment, SRAM buffer is located on the logic chip.

In one embodiment, the sense amp is pulled out of the memory bank and put on the processor or the memory logic chip. To improve density further, the memory bank area is increased to include the area that would have been used by sense amps.

Testing

It is still desirable to test the entire die stack. It is possible to use redundant blocks or redundant die to achieve high yield.

Another approach is to implement memory redundancy to achieve favorable manufacturing yield instead of using pre-tested, known-good-die for assembling the stack. Using this method, memory array devices will still need to be tested in the assembled or partially assembled stack with a logic chip that completes the memory array functionality sufficiently to fulfill the test procedures.

The logic chip may be manufactured using a less-expensive, older semiconductor manufacturing process technology. Functions that can be integrated into the inexpensive area on the logic chip may not be economically feasible to implement on the memory array or the processor chip which use newer, more advanced, more expensive semiconductor fabrication process technology.

When it is necessary to test the memory array with optional logic die stack, prior to assembly with the processor die, a sense amp is required either on the memory array or the logic die.

The final assembly step is to connect the processor die to the logic die. In a preferred embodiment of this disclosure, the top, or face, of the processor die is connected to the top, or face, of the logic chip.

In one embodiment, the memory array die stack is connected to the logic die by connecting F2F DRAM logic chip to TSP (not shown).

In this embodiment, DRAM core has 600 MHz clock; I/O logic is arranged with DRAM logic chip to TSP. SRAM buffer is put on top of DRAM logic chip and the row buffer is randomly addressed within the row.

Each row in each DRAM bank may have, in one embodiment, the capacity of 4K bytes, thus when the DRAM I/O row is open into the data buffer, the 4, 8, 16 or 32 bits of data is read out at a time.

Sensitivity of DRAM to Access Pattern

LPDDR, an abbreviation for Low-Power Double Data Rate, also known as Low-Power DDR synchronous DRAM or LPDDR SDRAM, is a type of double data rate synchronous DRAM that consumes less power and is targeted for mobile computers. It is also known as Mobile DDR and abbreviated as mDDR.

The effective bandwidth of the field-programmable gate array (FPGA) external memory, usually DRAM (or any RTR memory), is extremely sensitive to the access pattern. Non-blocking caches that handle thousands of outstanding misses (miss-optimized memory systems) can dynamically improve bandwidth utilization whenever memory accesses are irregular and application-specific optimizations are not available or are too costly in terms of design time. However, they require a memory controller with wide data ports on the processor side and cannot fully take advantage of the memory interfaces with multiple narrow ports that are common on system-on-chip (SoC) devices. Moreover, as their scope is limited to single memory requests, the access pattern they generate may cause frequent DRAM row conflicts, which further reduce DRAM bandwidth.

One solution is to generate the variable-length bursts to the memory controller.

Thus, by making memory accesses locally more sequential, the number of DRAM row conflicts is minimized, and by adapting the burst length on a per-request basis the bandwidth wastage is also minimized.

Memory Management Testing Circuit

Today's nanometer SoC designs typically embed many memories that are extremely sensitive to many different hardware-production defects. These defects affect three key production and profitability targets: quality, yield and reliability. There are solutions available today, however, that will help manufacturers produce reliable, high-yield, high-quality SoC devices.

For many years, built-in self-test (BIST) has been implemented in most embedded memories. Several good BIST-generation tools are currently on the market. BIST solutions help manufacturers reach the quality target and are implemented to tackle quality at two levels.

At the production level, most SoC manufacturers try to achieve 100 percent fault coverage to deliver a high-quality SoC. Rising chip complexity, however, has led to an increase in the complexity of production defects. To reach the goal of increased fault coverage at this level, chip designers need to implement complex BIST algorithms.

Mixed programmable synthesis BIST is a new BIST architecture that incorporates BIST algorithm synthesis as well as BIST programmability. This new architecture can implement custom high-wired BIST algorithms. It gives designers the choice of using the programmability feature on the production tester to improve the algorithm. At low silicon cost, this architecture meets the quality demands.

Yield is another concern. Increasing size, density, and complexity in memory technologies lead to higher defect density and a decrease in yield. Following memory defect detection during memory test, a hardware laser repair step is added into the production flow to enhance the memory yield. Laser repair induces an extremely long test time and extra hardware costs, both at the silicon level and at the production level, where extra laser equipment is needed.

A cost- and time-effective solution is built-in self-repair (BISR). BISR consists of replacing, on-silicon, the defective memory columns by spare columns available next to the functional memory. BISR is implemented at the column, row, block, or bit level. Using nonvolatile blocks to store the memory reconfiguration improves the memory production yield.

Reliability aspect is also considered by all the chip manufacturers. High memory size and high-end memory technologies often lead to an increasing number of defects that happen during the product life. Such defects are incredibly expensive to tackle since they imply in-the-field debug.

BISR solutions allow the memory to be tested in the field and the defective memory blocks to be replaced by redundant blocks that are not defective. If the memory contains critical contents, transparent BISR allows defective blocks to be tested and replaced without losing the original memory content. Such solutions, which ensure higher product reliability in the field, are available at low silicon cost.

In one embodiment, the GROQ TSP DRAM unit includes BISR.

More specifically, in one embodiment, BISR can be implemented by mapping into a tree structure of a bus and gated to use different portions of DRAM at different times by isolating data streams with flops.

In one embodiment, BISR can: (a) manage data stream locally; (b) create local streams; (c) create hierarchical streams, when necessary, by analogy to a pipe structure with many inlets and outlets to pipe at highest level think of one single stream or if required block sections to make several smaller pipes.

As was disclosed above, the memory burst mode can be also used (for example, dynamic random-access memory (DRAM)) to further increase the maximum transfer rate at different depth, that is to transmit data on both edges of bit clock.

For example, for Mobile DDR and abbreviated as mDDR, minimum burst size is four, and for LPDDR (Low-Power Double Data Rate), minimum burst size is 16.

More specialized RTR (e.g., DRAM) manages burst size from within the row, and access data into buffer.

For example, if certain number of bytes are put in word buffer to stream out fast, then 4DDR/5 3200 memory means that in the data bus each bit supports 3200 million transitions, so data rate is 3.2 GiB/s if the data is transmitted on both edges of bit clock.

Connectivity Description

Near-compute memory is most efficient when processor data signals are connected to a memory bank address and data inputs and data outputs with the highest bandwidth, lowest latency, data path using the smallest number of intervening logic elements.

For example, a memory die is attached to a processor die, and tens of thousands, or hundreds of thousands, or millions of data signals are connected between the memory die and the processor die. All columns on all the banks on the memory die have a short, direct path from memory bank inputs and outputs to the processor die data bus wires and registers.

More specifically, from a logical perspective, in one embodiment, columns of a memory bank output row would interface with a particular stream.

More specifically, from a logical perspective, in another embodiment, columns of the memory bank row outputs connect to a multiplexer switching network (e.g., multiplexer/demultiplexer or crossbar switch) on the processor die which in turn directs data to one stream or another.

More specifically, from a physical perspective, in one embodiment, a face-to-back die attach arrangement is implemented with signals connected using Through-Silicon Via (TSV) bonds.

More specifically, from a physical perspective, in another embodiment, a face-to-face die attach arrangement is implemented with signals connected using TSV bonds.

More specifically, from a physical perspective, in yet another embodiment, a face-to-face die attach arrangement is implemented with signals connected using microbump bonds. Microbump bonding (MBB) method ensures the micro-order direct bonding between the integrated circuit (IC) electrode and circuit substrate electrode. MBB consists of three elements: an IC chip with bumps, a circuit substrate, and a bonding adhesive. The binding force of the applied adhesive achieves electrical connections between the bumps on the IC.

In some embodiments, from a physical perspective, a face-to-face die attach arrangement is implemented with signals connected using hybrid bond pads. The term "hybrid bonding" loosely to refer to any alternative to thermocompression bonding that combines metal interconnect with some other form of bonding. In one or more embodiments, "hybrid bonding" includes adhesives. In one or more other embodiments, "hybrid bonding" involves various interconnect metals such as copper (Cu), indium (In), and silver (AG).

In some other embodiments, from a physical perspective, an interposer arrangement is implemented with signals connected using conductive traces on the interposer to connect terminals on the memory die to terminals on the processor die.

Processor-Memory Communication Features

A first die comprising multiple memory banks that can be addressed independently, attached to a second die that comprises processing elements.

In one embodiment, the processor is deterministic. In another embodiment, the processor is not deterministic.

Data signals or registers on the processor die provide substantially continuously independent connections.

On the memory die, to address inputs or registers on each bank of the memory die, the data signals or registers on the processor die are substantially continuously connected to memory bank inputs or registers on the memory die.

On the processor die, data signals or registers on the processor die are substantially continuously connected from memory bank outputs or registers on the memory die.

Multiplexer switching networks that filter or transfer data signals are located exclusively on the processor die. Memory bank row outputs connect to a multiplexer switching network (e.g., multiplexer/demultiplexer or crossbar switch) on the processor die which in turn directs data to one stream or another.

Near-Compute Memory Features

A memory device comprises a plurality of memory banks, wherein each bank has a plurality of rows for storing data. Each memory bank is addressable by a processor for writing data to selected rows in selected banks and for reading data from selected rows in selected banks, wherein data is read a predetermined time-period before the data is required to arrive at a compute element(s) of the processor and data is written to a memory at a pre-determined time-period that does not coincide with a memory refresh.

Process Flow

FIG. 16 is a flowchart illustrating a method 1600 of deterministic computing comprising a single core deterministic processor coupled to an off-chip deterministic near-compute memory unit, in accordance with some embodiments. The single core deterministic processor can be part of a system that further includes at least one computer processor (e.g., a host server) and a non-transitory computer-readable storage medium for storing computer executable instructions. The single core deterministic processor may be a TSP. The method 1600 may be initiated by a compiler operating on the at least one computer processor. The compiler may utilize as its input a model (e.g., a machine learning model) for the single core deterministic processor and outputs instructions for configuring operation of the single core deterministic processor.

The single core deterministic processor stores 1610 set of data in a plurality of data banks of the off-chip deterministic near-compute memory unit, the plurality of data banks having a common global memory access, a common control bus, and a common data output bus. The single core deterministic processor initiates 1620, via the common control bus, retrieval of the set of data from the plurality of data banks using the common global memory access, the retrieved set of data passed via the common data output bus onto at least one stream register of the single core deterministic processor.

In some embodiments, the single core deterministic processor accesses the off-chip deterministic near-compute memory unit sequentially by adapting a burst length on a per-request basis to minimize a bandwidth wastage. Additionally, or alternatively, a global access may be provided to the off-chip deterministic near-compute memory unit from the single core deterministic processor via a plurality of pins on a data input/output (I/O) subsystem of the off-chip deterministic near-compute memory unit.

Data/Instructions to Processors/Programs

While 'data' and 'information' often are used interchangeably (e.g., 'data processing' and 'information processing'), the term 'datum' (plural 'data') typically signifies a representation of the value of a fact (e.g., the measurement of a physical quantity such as the current in a wire, or the price of gold), or the answer to a question (e.g., "yes" or "no"), while the term 'information' typically signifies a set of data with structure (often signified by 'data structure'). A data structure is used in commerce to transform an electronic device for use as a specific machine as an article of manufacture (see in re Lowry, 32 F.3d 1579 [CAFC, 1994]). Data and information are physical objects, for example binary data (a 'bit', usually signified with '0' and '1') enabled with two levels of voltage in a digital circuit or electronic component. For example, data can be enabled as an electrical, magnetic, optical, or acoustical signal or state; a quantum state such as a particle spin that enables a 'qubit'; or a physical state of an atom or molecule. All such data and information, when enabled, are stored, accessed, transferred, combined, compared, or otherwise acted upon, actions that require and dissipate energy.

As used herein, the term 'process' signifies an artificial finite ordered set of physical actions ('action' also signified by 'operation' or 'step') to produce at least one result. Some types of actions include transformation and transportation. An action is a technical application of one or more natural laws of science or artificial laws of technology. An action often changes the physical state of a machine, of structures of data and information, or of a composition of matter. Two or more actions can occur at about the same time, or one action can occur before or after another action if the process produces the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing"). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. As used herein, the term 'thread' signifies a subset of an entire process. A process can be partitioned into multiple threads that can be used at or about at the same time.

As used herein, the term 'rule' signifies a process with at least one logical test (signified, e.g., by 'IF test IS TRUE THEN DO process')). As used herein, a 'grammar' is a set of rules for determining the structure of information. Many forms of knowledge, learning, skills, and styles are authored, structured, and enabled—objectively—as processes and/or rules—e.g., knowledge and learning as functions in knowledge programming languages.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points which are attached to conductive components, typically a conductive wire or line, or an optical fiber, with one conductive component end attached to the component and the other end attached to another component, typically as part of a circuit with current or photon flows. There are at least three types of electrical components: passive, active and electro-mechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., light-emitting diodes (LEDs), liquid crystal displays (LCDs), lamps, cathode ray tubes (CRTs), plasma displays, etc.). Electromechanical components affect current flow using mechanical forces and structures—such components include switches, relays, protection devices (e.g., fuses, circuit breakers), heat sinks, fans, cables, wires, terminals, connectors, and printed circuit boards.

As used herein, the term 'netlist' is a specification of components comprising an electric circuit, and electrical connections between the components. The programming language for the Simulation Program with Integrated Circuit Emphasis (SPICE) circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and SoC'. Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program (defined below). The term 'module' also can signify one or more interconnected electronic components, such as digital logic devices. A process comprising a module, if specified in a programming language (defined below), such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilinx or Intel's Altera), Random Access Memories (RAMs) or microprocessors. For example, data and information is transformed using data as an address in RAM or ROM that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals [FACT]. How a module is used, its function, is mostly independent of the physical form in which the module is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules, e.g., a central processing unit ('CPU') module; an input/output ('I/O') module, a memory control module, a network control module, and/or other modules. The term 'processor' can also signify one or more processors, or one or more processors with multiple computational cores/CPUs, specialized processors (for example, graphics processors or signal processors), and their combinations. Where two or more processors interact, one or more of the processors can be remotely located relative to the position of the other processors. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, deoxyribonucleic acid (DNA) transformations, quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing, and retrieving data and information, using any process or structure equivalent to the bioelectric structures and processes of the human brain.

The one or more processors also can use a process in a 'cloud computing' or 'timesharing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified network interfaces ('interface' defined below) (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the Boolean logical operations using electronic gates that can comprise transistors, with the addition of memory (for example, memory structured with flip-flops using the NOT-AND or NOT-OR operation). Any processor that can perform the logical AND, OR and NOT operations (or their equivalent) is Turing-complete and computationally universal [FACT]. A computer can comprise a simple structure, for example, comprising an I/O module, a CPU module, and a memory that performs, for example, the process of inputting a signal, transforming the signal, and outputting the signal with no human intervention.

As used herein, the term 'programming language' signifies a structured grammar for specifying sets of operations and data for use by modules, processors, and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed disclosures is available on the Internet, such as from a source code library such as Github.

As used herein, the term 'program' (also referred to as an 'application program') signifies one or more processes and data structures that structure a module, processor, or computer to be used as a "specific machine" (see in re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network.

Example Computer System Architecture

Figure 17A:
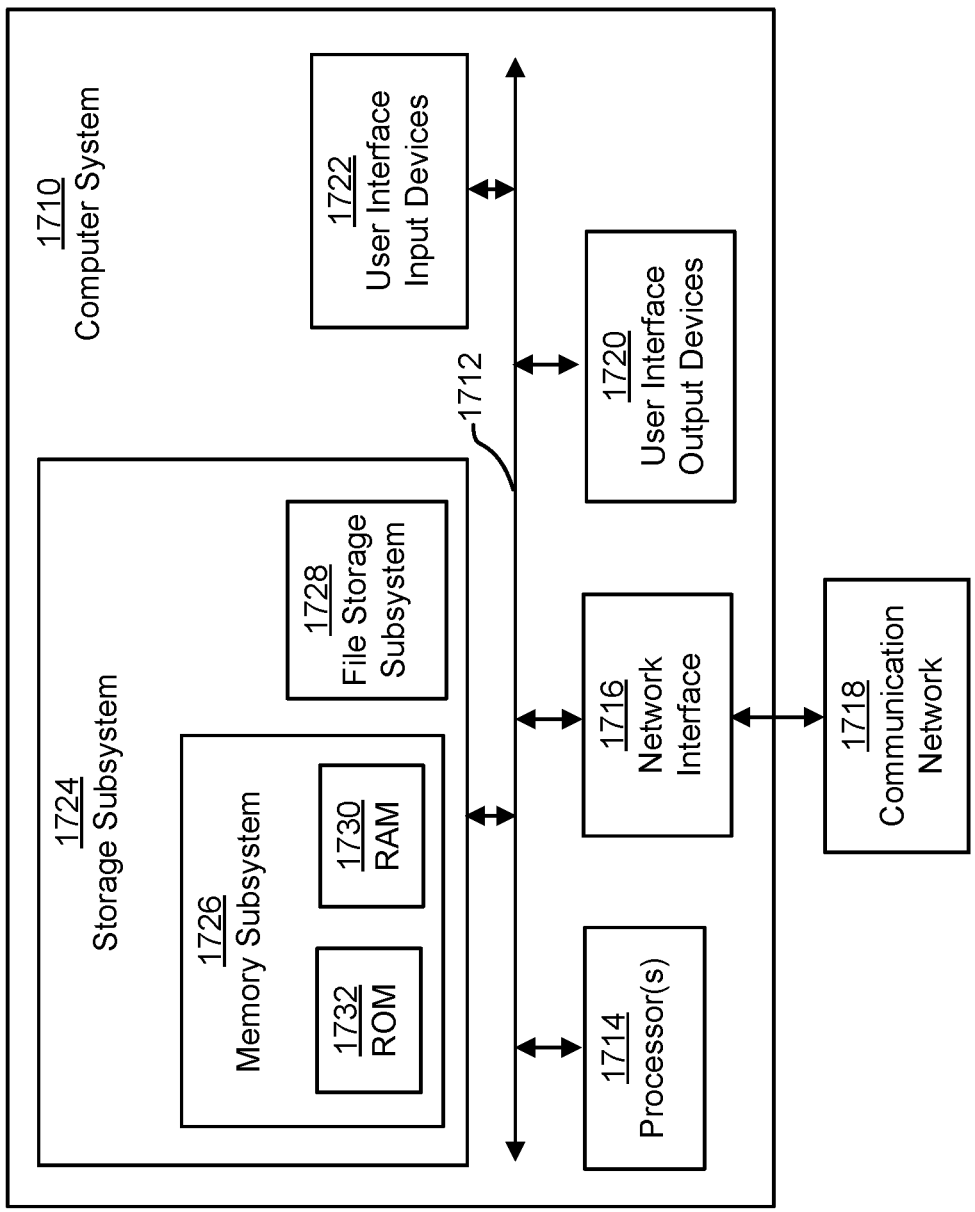
FIG. 17A is an example abstract diagram of a computer system suitable for enabling embodiments of the claimed disclosures for use in commerce, in accordance with some embodiments.

FIG. 17A is an example abstract diagram of a computer system suitable for enabling embodiments of the claimed disclosures, in accordance with some embodiments.

In FIG. 17A, the structure of computer system 1710 typically includes at least one computer 1714 which communicates with peripheral devices via bus subsystem 1712. Typically, the computer includes a processor (e.g., a microprocessor, graphics processing unit, or digital signal processor), or its electronic processing equivalents, such as an ASIC or FPGA. Typically, peripheral devices include a storage subsystem 1724, comprising a memory subsystem 1726 and a file storage subsystem 1728, user interface input devices 1722, user interface output devices 1720, and/or a network interface subsystem 1716. The input and output devices enable direct and remote user interaction with computer system 1710. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium, and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

Any embodiment of the present disclosure is limited neither to an electronic digital logic computer structured with programs nor to an electronically programmable device. For example, the claimed embodiments can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 1710 depicted in FIG. 17A is intended only as an example. Many other structures of computer system 1710 have components than the computer system depicted in FIG. 17A.

Network interface subsystem 1716 provides an interface to outside networks, including an interface to communication network 1718, and is coupled via communication network 1718 to corresponding interface devices in other computer systems or machines. Communication network 1718 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 1718 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or Integrated Services Digital Network (ISDN)), (asynchronous) digital subscriber line (DSL) unit, Firewire interface, universal serial bus (USB) interface, and the like. Communication algorithms ('protocols') can be specified using one or communication languages, such as Hypertext Transfer Protocol (HTTP), Transmission Control Protocol/Internet Protocol (TCP/IP), Real-time Transport Protocol/Real Time Streaming Protocol (RTP/RTSP), Internetwork Packet Exchange (IPX) protocol and/or User Datagram Protocol (UDP).

User interface input devices 1722 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 1710 or onto communication network 1718. User interface input devices typically enable a user to select objects, icons, text and the like that appear on some types of user interface output devices, for example, a display subsystem.

User interface output devices 1720 can include a display subsystem, a printer, a fax machine, or a non-visual communication device such as audio and haptic devices. The display subsystem can include a CRT, a flat-panel device such as an LCD, an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 1710 to the user or to another machine or computer system. Such devices are connected by wire or wirelessly to a computer system. Note that some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits, that use any of the above input or output devices.

Memory subsystem 1726 typically includes several memories including a main RAM 1730 (or other volatile storage device) for storage of instructions and data during program execution and a ROM 1732 in which fixed instructions are stored. File storage subsystem 1728 provides persistent storage for program and data files, and can include a hard disk drive, a floppy disk drive along with associated removable media, a CD-ROM drive, an optical drive, a flash memory such as a USB drive, or removable media cartridges. If computer system 1710 includes an input device that performs optical character recognition, then text and symbols printed on a physical object (such as paper) that can be used as a device for storage of program and data files. The databases and modules used by some embodiments can be stored by file storage subsystem 1728.

Bus subsystem 1712 provides a device for transmitting data and information between the various components and subsystems of computer system 1710. Although bus subsystem 1712 is depicted as a single bus, alternative embodiments of the bus subsystem can use multiple busses. For example, a main memory using RAM can communicate directly with file storage systems using DMA systems.

Figure 17B:
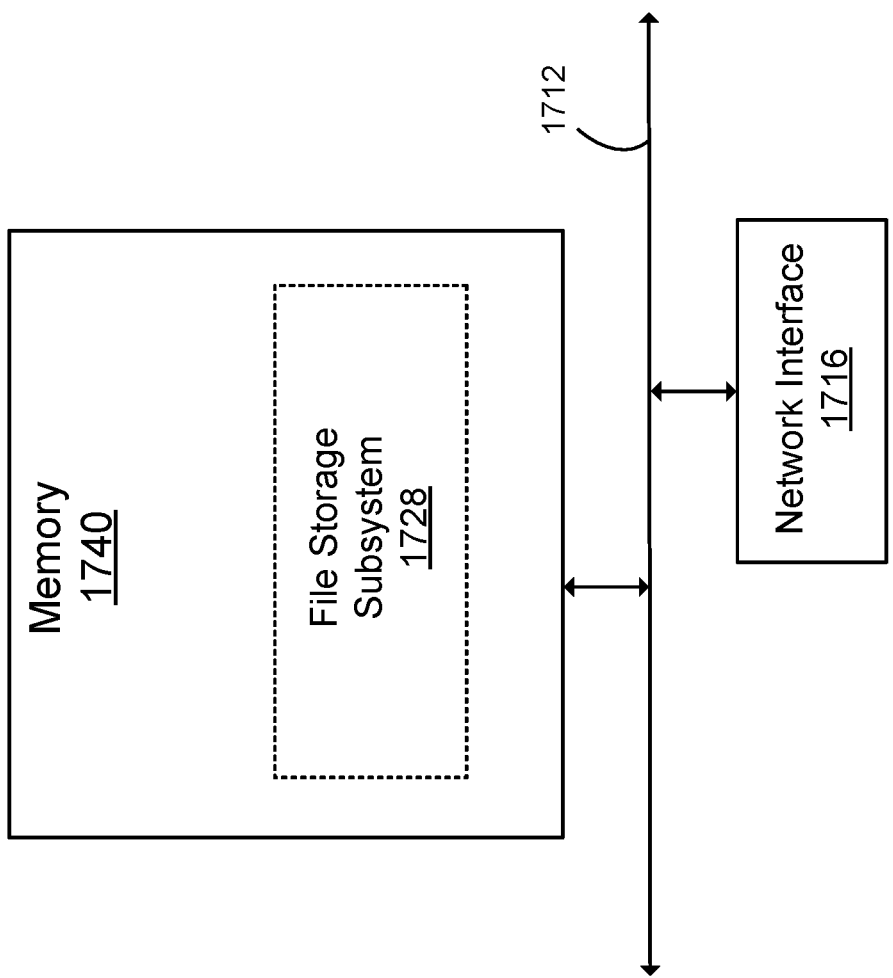
FIG. 17B is another abstract diagram of a computer system suitable for enabling embodiments of the claimed disclosures for use in commerce, in accordance with some embodiments.

FIG. 17B is another abstract diagram of a computer system suitable for enabling embodiments of the claimed disclosures, in accordance with some embodiments. FIG. 17B depicts a memory 1740 such as a non-transitory, processor readable data and information storage medium associated with file storage subsystem 1728, and/or with network interface subsystem 1716 (e.g., via bus subsystem 1712), and can include a data structure specifying a circuit design. The memory 640 can be a hard disk, a floppy disk, a CD-ROM, an optical medium, removable media cartridge, or any other medium that stores computer readable data in a volatile or non-volatile form, such as text and symbols on a physical object (such as paper) that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

Figure 18:
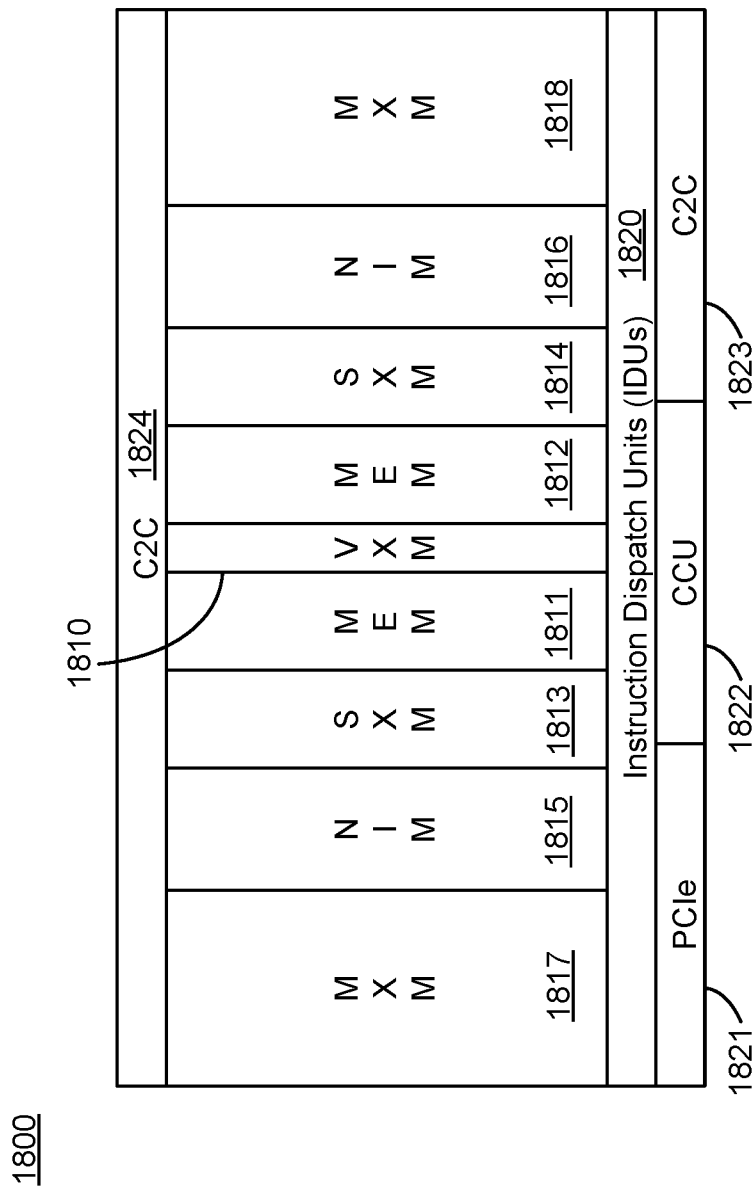
FIG. 18 illustrates an example machine learning processor according to one embodiment of the claimed disclosures for use in commerce.

FIG. 18 illustrates an example machine learning processor according to one embodiment. Machine learning processor 1800 (aka, Artificial Intelligence (AI) processor) may include memory and arithmetic units optimized for multiplying and adding input data with weight sets (e.g., trained or being trained) for machine learning applications (e.g., training or inference). For example, machine learning processor 1800 includes a VXM 1810 for performing operations on vectors (i.e., one-dimensional arrays of values). Other elements of the system are arranged symmetrically on either side of the VXM 1810 to optimize processing speed. For example, the VXM 1810 is adjacent to MEMs 1811-1812, SXMs 1813-1814 to control routing of data, data format and presentation controllers (or numerical interpretation modules (NIMs)) 1815-1816, and MXMs 1817-1818. An ICU 1820 controls the flow of data and execution of operations across blocks 1810-1818, for example. Machine learning processor 1800 includes communications circuits such as chip-to-chip (C2C) circuits 1823-1824 and an external communication circuit (e.g., PCIe) 1821. Machine learning processor 1800 may further include a chip control unit (CCU) 1822 to control boot operations, clock resets, and other low level setup operations, for example.

In a machine learning processor, speed and power consumption tradeoffs may not be the same as in a typical microprocessor architecture because a machine learning processor may perform far more arithmetic operations, such as vector and matrix multiplication. Accordingly, embodiments of the disclosure described above may result in unexpectedly large reductions in power consumption compared to a typical microprocessor. In one embodiment, data storage modules may be implemented in a wide range of applications across machine learning processor 1800 to reduce power consumption. For example, data storage modules according to the embodiments described above may be used extensively in the MXM and VXM units to reduce power consumption of the chip, for example. Advantageously, once implemented, the processor may be analyzed to determine where bits are switching more often or less often. Based on usage statistics, for example, the data storage module may be modified to reduce power consumption by associating bits that change at a higher frequency with multi-bit flip-flops (MBFFs) and associating bits that change less often, and/or are in a critical processing path, with lower order MBFFs or single-bit flip-flops (SBFFs), for example. A change to a data storage module definition, for example, may cause all the instances of the data storage module to be changed across the entire processor, thus promulgating, and multiplying the reduction in power consumption.

Example Semantic Configuration

The signifier 'commercial solution' signifies, solely for the following paragraph, a technology domain-specific (and thus non-preemptive—see Bilski): electronic structure, process for a specified machine, manufacturable circuit (and its Church-Turing equivalents), or a composition of matter that applies science and/or technology for use in commerce to solve an unmet need of technology.

The signifier 'abstract' (when used in a patent claim for any enabled embodiments disclosed herein for a new commercial solution that is a scientific use of one or more laws of nature (see Benson), and that solves a problem of technology {see Diehr} for use in commerce—or improves upon an existing solution used in commerce {see Diehr})—is precisely defined by the inventor(s) (see MPEP 2111.01 (9th edition, Rev. 08.2017)) as follows:

a) a new commercial solution is 'abstract' if it is not novel (e.g., it is so well known in equal prior art (see Alice) and/or the use of equivalent prior art solutions is long prevalent (see Bilski) in science, engineering or commerce), and thus unpatentable under 35 U.S.C. 102, for example, because it is 'difficult to understand' (see Merriam-Webster definition for 'abstract') how the commercial solution differs from equivalent prior art solutions; or b) a new commercial solution is 'abstract' if the existing prior art includes at least one analogous prior art solution (see KSR), or the existing prior art includes at least two prior art publications that can be combined (see Alice) by a skilled person (often referred to as a person having ordinary skill in the art (PHOSITA), see MPEP 2141-2144 (9th edition, Rev. 08.2017)) to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described (see Mayo) with unspecified components, parameters or functionality, so that a PHOSITA is unable to instantiate an embodiment of the new solution for use in commerce, without, for example, requiring special programming (see Katz) (or, e.g., circuit design) to be performed by the PHOSITA, and is thus unpatentable under 35 U.S.C. 112, for example, because it is 'difficult to understand' how to use in commerce any embodiment of the new commercial solution.

CONCLUSION

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of the present disclosure comprises a particular feature, structure, function, or characteristic, it is within the knowledge and understanding of a skilled person to use such feature, structure, function, or characteristic in connection with another embodiment of the present disclosure whether explicitly described, for example, as a substitute for another feature, structure, function, or characteristic.

In view of the Detailed Description, a skilled person will understand that many variations of any embodiment of the present disclosure can be enabled, such as function and structure of elements, described herein while being as useful as the embodiment of the present disclosure. One or more elements of an embodiment of the present disclosure can be substituted for one or more elements in another embodiment, as will be understood by a skilled person. Writings about any embodiment of the present disclosure signify its use in commerce, thereby enabling other skilled people to similarly use this embodiment of the present disclosure in commerce.

This Detailed Description is fitly written to provide knowledge and understanding. It is neither exhaustive nor limiting of the precise structures described but is to be accorded the widest scope consistent with the disclosed principles and features. Without limitation, all equivalents described, signified or incorporated by reference (or explicitly incorporated) in this patent application are specifically incorporated into the Detailed Description. In addition, all variations described, signified, or incorporated with respect to any one embodiment of the present disclosure also can be included with any other embodiment. Any such variations include both currently known variations as well as future variations, for example any element used for enablement includes a future equivalent element that provides the same function, regardless of the structure of the future equivalent element.

It is intended that the domain of the set of claimed disclosures and their embodiments be defined and judged by the following Claims and their equivalents. The Detailed Description includes the following Claims, with each Claim standing on its own as a separate claimed disclosure. Any embodiment can have more structure and features than are explicitly specified in the Claims.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A deterministic apparatus comprising:
    a deterministic near-compute memory communicatively coupled with and proximate to a deterministic processor, the deterministic near-compute memory comprising a plurality of data banks having a global memory address space, a control bus, a data input bus, and a data output bus for each data bank; and
    the deterministic processor configured to initiate, via the control bus, retrieval of a set of data from the plurality of data banks, the retrieved set of data comprising at least one row of a selected one of the data banks passed via the data output bus onto a plurality of stream registers of the deterministic processor,
    wherein at least one memory bank of the deterministic near-compute memory is a low random transaction rate (RTR) dynamic random-access memory (DRAM).

2. The deterministic apparatus of claim 1, wherein the deterministic processor is further configured to initiate, via the control bus, writing another set of data to the plurality of data banks, the other set of data comprising one or more rows of a selected data bank of the plurality of data banks passed via the data input bus from the plurality of stream registers of the deterministic processor.

3. The deterministic apparatus of claim 1, wherein:
    the plurality of data banks of the deterministic near-compute memory is placed on a first integrated circuit device; and
    the deterministic processor is placed on a second integrated circuit device.

4. The deterministic apparatus of claim 3, wherein the first and second integrated circuit devices are positioned on an interposer.

5. The deterministic apparatus of claim 3, wherein the first and second integrated circuit devices are positioned in a face-to-face configuration, and interconnects between the first and second integrated circuit devices are selected from the group consisting of: microbump bonding, hybrid bonding, and Through-Silicon Via (TSV) bonds.

6. The deterministic apparatus of claim 1, wherein the deterministic near-compute memory is selected from the group consisting of: a dynamic random-access memory, a static random-access memory, a magnetoresistive random-access memory, a NOR memory, a NAND memory, a FLASH memory, a phase change memory, a ferroelectric memory, and a nanotube random-access memory.

7. The deterministic apparatus of claim 1, wherein at least one memory bank of the deterministic near-compute memory has a memory array on a first integrated circuit device coupled to a set of sense amplifiers on a second integrated circuit device.

8. The deterministic apparatus of claim 1, further comprising:
the low random transaction rate (RTR) dynamic random-access memory (DRAM) as part of the deterministic near-compute memory; and
a plurality of concurrent data lines of the data output bus between the deterministic processor and the low random transaction rate (RTR) dynamic random-access memory (DRAM) for passing the retrieved set of data from the low random transaction rate (RTR) dynamic random-access memory (DRAM) to the deterministic processor.

9. The deterministic apparatus of claim 1, wherein the deterministic near-compute memory includes the low random transaction rate (RTR) dynamic random-access memory (DRAM) configured to have the global memory address space for reducing power consumption and power dissipation of the deterministic apparatus.

10. The deterministic apparatus of claim 1, wherein the deterministic near-compute memory includes the low random transaction rate (RTR) dynamic random-access memory (DRAM) configured as a plurality of dynamic random-access memory (DRAM) banks capable of concurrent access.

11. The deterministic apparatus of claim 1, wherein the deterministic near-compute memory is configured for a concurrent global access to the plurality of data banks simultaneously.

12. The deterministic apparatus of claim 1, wherein:
the deterministic near-compute memory includes a row buffer for storing write operations, the row buffer configured to delay the write operations to the deterministic near-compute memory;
the plurality of data banks is configured to simultaneously retrieve the set of data directly into the row buffer; and
at least one of the plurality of stream registers is configured to have the set of data from the row buffer loaded with a direction of dataflow toward a slice intending to operate on the requested set of data on a next clock cycle under one or more instructions initiated by the deterministic processor.

13. The deterministic apparatus of claim 1, wherein the global memory address space is configured to use a plurality of switch execution modules (SXMs) of the deterministic processor to provide an inter-lane switching mechanism for allowing any computing element of the deterministic processor from any superlane access to any requested data residing either on the deterministic near-compute memory or residing on a plurality of static random-access memory (SRAM) banks.

14. The deterministic apparatus of claim 1, further comprising:
multiplexer switching network for filtering data signals, the multiplexer switching network located substantially exclusively on a die of the deterministic processor, and memory bank row outputs of the deterministic near-compute memory connect to the multiplexer switching network, wherein
the multiplexer switching network comprises a crossbar switch on the die whereby the crossbar switch directs data to at least one stream on the deterministic processor.

15. The deterministic apparatus of claim 1, wherein the deterministic processor is coupled to the deterministic near-compute memory via a passive interposer or via an active interposer.

16. The deterministic apparatus of claim 1, further comprising a plurality of deterministic processors coupled to the deterministic near-compute memory via a passive interposer or via an active interposer.

17. A non-transitory computer-readable storage medium having stored thereon executable instructions, which when executed by a computer processor cause the computer processor to:
initiate storing a set of data in a plurality of data banks of a deterministic near-compute memory coupled to a deterministic processor, the plurality of data banks having a global memory address space, a control bus, a data input bus, and a data output bus for each data bank; and
initiate, via the control bus, retrieval of a set of data from the plurality of data banks using the global memory address space, the retrieved set of data comprising at least one row of a selected one of the data banks passed via the data output bus onto a plurality of stream registers of the deterministic processor,
wherein at least one memory bank of the deterministic near-compute memory is a low random transaction rate (RTR) dynamic random-access memory (DRAM).

18. The non-transitory computer-readable storage medium of claim 17, wherein the instructions further cause the computer processor to:
initiate accessing the deterministic near-compute memory sequentially by adapting a burst length on a per-request basis to minimize a bandwidth wastage; and
initiate accessing the deterministic near-compute memory from the deterministic processor via a plurality of pins on a data input/output (I/O) subsystem associated with an integrated circuit device of the deterministic near-compute memory.

19. The non-transitory computer-readable storage medium of claim 17, wherein at least one memory bank of the deterministic near-compute memory has a memory array on a first integrated circuit device coupled to a set of sense amplifiers on a second integrated circuit device.

20. The non-transitory computer-readable storage medium of claim 17, wherein the deterministic near-compute memory is configured for a concurrent global access to the plurality of data banks simultaneously.

* * * * *